United States Patent
Visconti et al.

(10) Patent No.: US 12,050,784 B2
(45) Date of Patent: Jul. 30, 2024

(54) DATA MASKING FOR MEMORY

(71) Applicant: Micron Technology, Inc., Boise, ID (US)

(72) Inventors: Angelo Visconti, Appiano Gentile (IT); Jahanshir Javanifard, Carmichael, CA (US); Daniele Vimercati, El Dorado Hills, CA (US)

(73) Assignee: Micron Technology, Inc., Boise, ID (US)

( * ) Notice: Subject to any disclaimer, the term of this patent is extended or adjusted under 35 U.S.C. 154(b) by 116 days.

(21) Appl. No.: 17/730,777

(22) Filed: Apr. 27, 2022

(65) Prior Publication Data

US 2023/0350582 A1    Nov. 2, 2023

(51) Int. Cl.
*G06F 3/06* (2006.01)

(52) U.S. Cl.
CPC .......... *G06F 3/0623* (2013.01); *G06F 3/0655* (2013.01); *G06F 3/0679* (2013.01)

(58) Field of Classification Search
CPC .. G06F 12/14; G06F 12/1433; G06F 12/1408; G06F 12/1416; G06F 12/145; G06F 12/1441; G06F 21/44; G06F 21/575; G06F 21/64; G06F 21/79; G06F 21/4403; G06F 3/0623; G06F 3/0655; G06F 3/0679; G06F 12/0891; G06F 12/0846; G06F 12/0862; G06F 12/0238; G06F 12/0646; G06F 12/0875; G06F 12/0815; G06F 12/0895; G06F 2212/60; G06F 2212/455; G06F 2212/1016; G06F 2212/1052; G06F 2212/2022; G06F 11/1012; G11C 11/4078; G11C 7/24; G11C 16/22

See application file for complete search history.

(56) References Cited

U.S. PATENT DOCUMENTS

| | | | | |
|---|---|---|---|---|
| 5,991,197 A | * | 11/1999 | Ogura | G11C 16/22 365/185.11 |
| 2002/0166061 A1 | * | 11/2002 | Falik | G06F 8/654 711/E12.099 |
| 2006/0294397 A1 | * | 12/2006 | Baker | G06F 12/1433 711/E12.098 |
| 2009/0063799 A1 | * | 3/2009 | Berenbaum | G06F 12/1441 711/E12.091 |
| 2009/0089526 A1 | * | 4/2009 | Kuo | G11C 16/22 711/E12.091 |
| 2017/0277896 A1 | * | 9/2017 | Parker | G06F 3/04883 |

(Continued)

*Primary Examiner* — Tracy C Chan
(74) *Attorney, Agent, or Firm* — Holland & Hart LLP

(57) ABSTRACT

Methods, systems, and devices for data masking for memory are described. A memory device may set multiple data masking flags for associated memory array(s) at power-up. Each data masking flag may be associated with a respective page of memory cells and may indicate whether the data stored in the respective page is masked data, or whether the data is new, unmasked data. Data existing at a previous power-down may be masked until an initial write or activate command has been performed on the page after power-up, where the initial write or activate command may result in writing masked data, write data, or a combination thereof to the page. After previously stored data is overwritten to a page, the flag associated with the page may be reset, which may indicate that data stored at the page is available to be read.

33 Claims, 9 Drawing Sheets

(56) References Cited

U.S. PATENT DOCUMENTS

2018/0307630 A1* 10/2018 Rusten ................ G06F 13/1668
2018/0373898 A1* 12/2018 Grocutt ............... G06F 12/1416
2021/0326134 A1* 10/2021 Grocutt ............... G06F 12/1441

* cited by examiner

DATA MASKING FOR MEMORY

FIELD OF TECHNOLOGY

The following relates to one or more systems for memory, including data masking for memory.

BACKGROUND

Memory devices are widely used to store information in various electronic devices such as computers, user devices, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read (e.g., sense, detect, retrieve, identify, determine, evaluate) a stored state in the memory device. To store information, a component may write (e.g., program, set, assign) the state in the memory device.

Various types of memory devices exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, not-or (NOR) and not-and (NAND) memory devices, and others. Memory cells may be described in terms of volatile configurations or non-volatile configurations. Memory cells configured in a non-volatile configuration may maintain stored logic states for extended periods of time even in the absence of an external power source. Memory cells configured in a volatile configuration may lose stored states when disconnected from an external power source. FeRAM may be able to achieve densities similar to volatile memory but may have non-volatile properties due to the use of a ferroelectric capacitor as a storage device.

DETAILED DESCRIPTION

Figure 1:
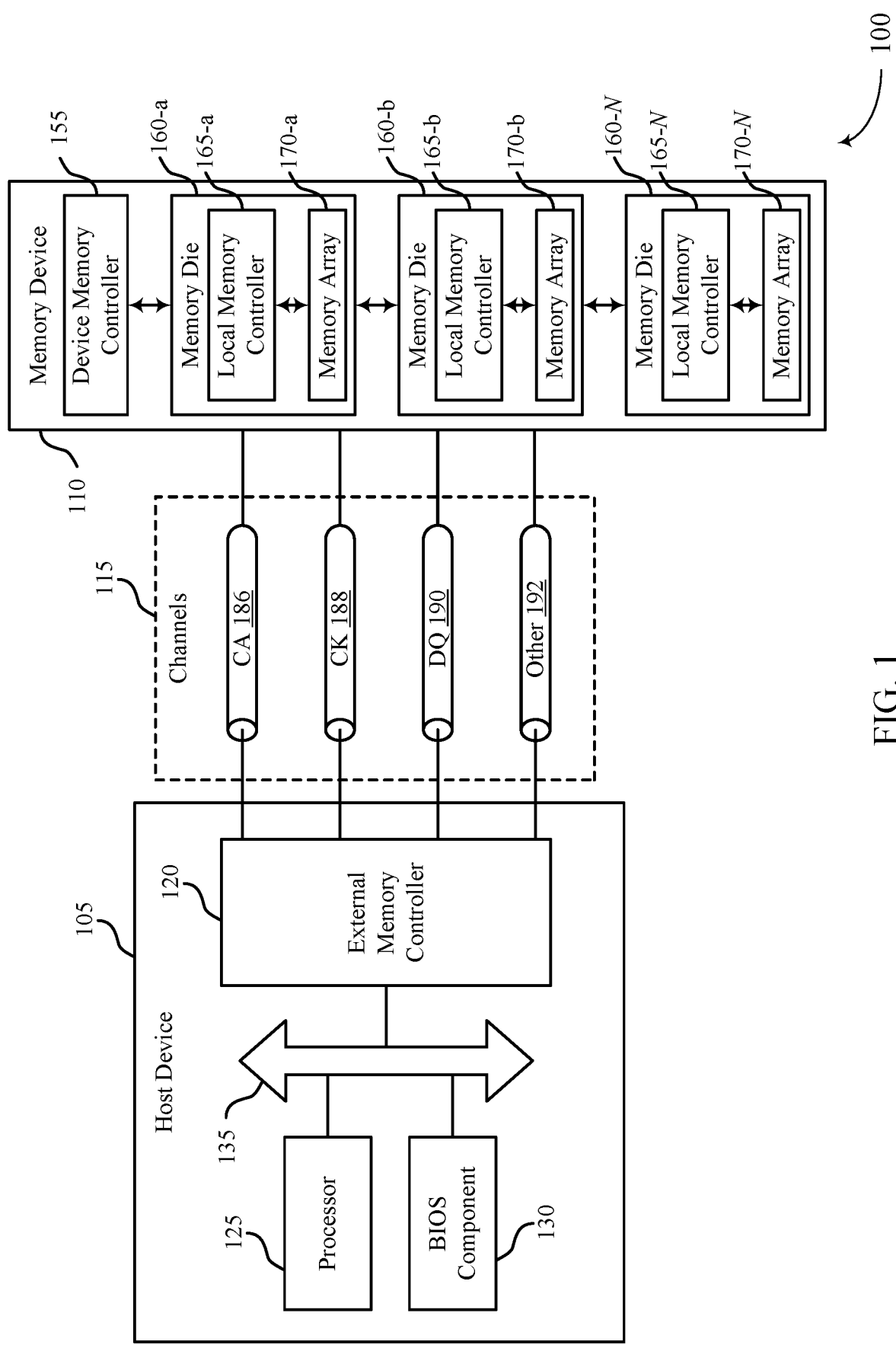
FIG. 1 illustrates an example of a system that supports data masking for memory in accordance with examples as disclosed herein.

In some cases, one or more volatile memory devices within a host device may be replaced by one or more respective non-volatile memory devices that may have a lower cost, similar operation, and similar timing to the replaced volatile memory device(s). However, replacing volatile memory devices with non-volatile memory devices may result in some increased security risks (e.g., vulnerability to hacking) because previously stored data (e.g., data stored before power-down) may still be detectable at power-up for a non-volatile memory device. For example, after power-up, if the host device issues a read command before first issuing a write command, the data read out by a non-volatile memory device may be data that was previously written to the memory device before power-down. Thus, data written to the memory device before power-down may still be accessible a next time the device is powered on. In some cases, these security issues may be addressed by triggering the memory device to wipe one or more associated memory arrays (e.g., delete, erase, overwrite data) at power-up or power-down. However, such wiping of the memory array(s) may increase a power-up or power-down time (e.g., above a permitted time) and may increase power consumption (e.g., above an available power), such that the timing or the power consumption, or both, may not meet one or more constraints of the memory device.

In accordance with techniques and methods described herein, a non-volatile memory device may maintain data stored at associated memory array(s) at power-up, and may protect the data from security issues by setting multiple data masking flags for the associated memory array(s). Each data masking flag may, for example, be associated with a page (e.g., row) of memory cells and may indicate whether the data stored in the page is masked (e.g., protected) data (e.g., stored before power-down), or whether the data is new, unmasked data (e.g., accessible data, unprotected data). The memory array may include multiple pages (e.g., rows) and each page may include multiple memory cells accessible by a same word line. Data existing at a previous power-down may be masked until an initial write or activate (ACT) command has been performed on the page after power-up, where the initial write or ACT command may result in writing masked data (e.g., a masked data pattern), write data (e.g., user data), or a combination thereof to the page. After previously stored data is overwritten to a page, the flag associated with the page may be reset, which may indicate that data stored at the page is available to be read.

Features of the disclosure are initially described in the context of systems and dies as described with reference to FIGS. 1 and 2. Features of the disclosure are described in the context of flow diagrams as described with reference to FIGS. 3-5. These and other features of the disclosure are further illustrated by and described with reference to an apparatus diagram and flowcharts that relate to data masking for memory as described with reference to FIGS. 6-9.

FIG. 1 illustrates an example of a system 100 that supports data masking for memory in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system 100 that is operable to store data for one or more other components of the system 100.

Portions of the system 100 may be examples of the host device 105. The host device 105 may be an example of a processor (e.g., circuitry, processing circuitry, a processing component) within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host (e.g., host device 105).

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other functions.

The memory device 110 may be operable to store data for the components of the host device 105. In some examples, the memory device 110 (e.g., operating as a secondary-type device to the host device 105, operating as a dependent-type to the host device 105) may respond to and execute commands provided by the host device 105 through the external memory controller 120. Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide functionality (e.g., control functionality) for the system 100 or the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include instructions (e.g., a program, software) stored in one or more of read-only memory (ROM), flash memory, or other non-volatile memory.

The memory device 110 may include a device memory controller 155 and one or more memory dies 160 (e.g., memory chips) to support a capacity (e.g., a desired capacity, a specified capacity) for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store one or more bits of data. A memory device 110 including two or more memory dies 160 may be referred to as a multi-die memory or a multi-die package or a multi-chip memory or a multi-chip package.

The device memory controller 155 may include components (e.g., circuitry, logic) operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive information (e.g., data, commands, or both) from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include components (e.g., circuitry, logic) operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other components operable for supporting described operations of the device memory controller 155 or local memory controller 165 or both.

The external memory controller 120 may be operable to enable communication of information (e.g., data, commands, or both) between components of the system 100 (e.g., between components of the host device 105, such as the processor 125, and the memory device 110). The external memory controller 120 may process (e.g., convert, translate) communications exchanged between the components of the host device 105 and the memory device 110. In some examples, the external memory controller 120, or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be an example of a transmission medium that carries information between the host device 105 and the memory device 110. Each channel 115 may include one or more signal paths (e.g., a transmission medium, a conductor) between terminals associated with the components of the system 100. A signal path may be an example of a conductive path operable to carry a signal. For example, a channel 115 may be associated with a first terminal (e.g., including one or more pins, including one or more pads) at the host device 105 and a second terminal at the memory device 110. A terminal may be an example of a conductive input or output point of a device of the system 100, and a terminal may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

A memory device 110 may set multiple data masking flags for associated memory array(s) at power-up. Each data masking flag may, for example, be associated with a page (e.g., row) of memory cells and may indicate whether the data stored in the page is masked (e.g., protected) data, or whether the data is new, unmasked data (e.g., accessible data, unprotected data). The memory array may include multiple pages (e.g., rows) and each page may include multiple memory cells accessible by a same word line. Data existing at a previous power-down may be masked until an initial write or ACT command has been performed on the page after power-up, where the initial write or ACT command may result in writing masked data (e.g., a masked data pattern), write data (e.g., user data), or a combination thereof to the page. After previously stored data is overwritten to a page, the flag associated with the page may be reset, which may indicate that data stored at the page is available to be read.

Figure 2:
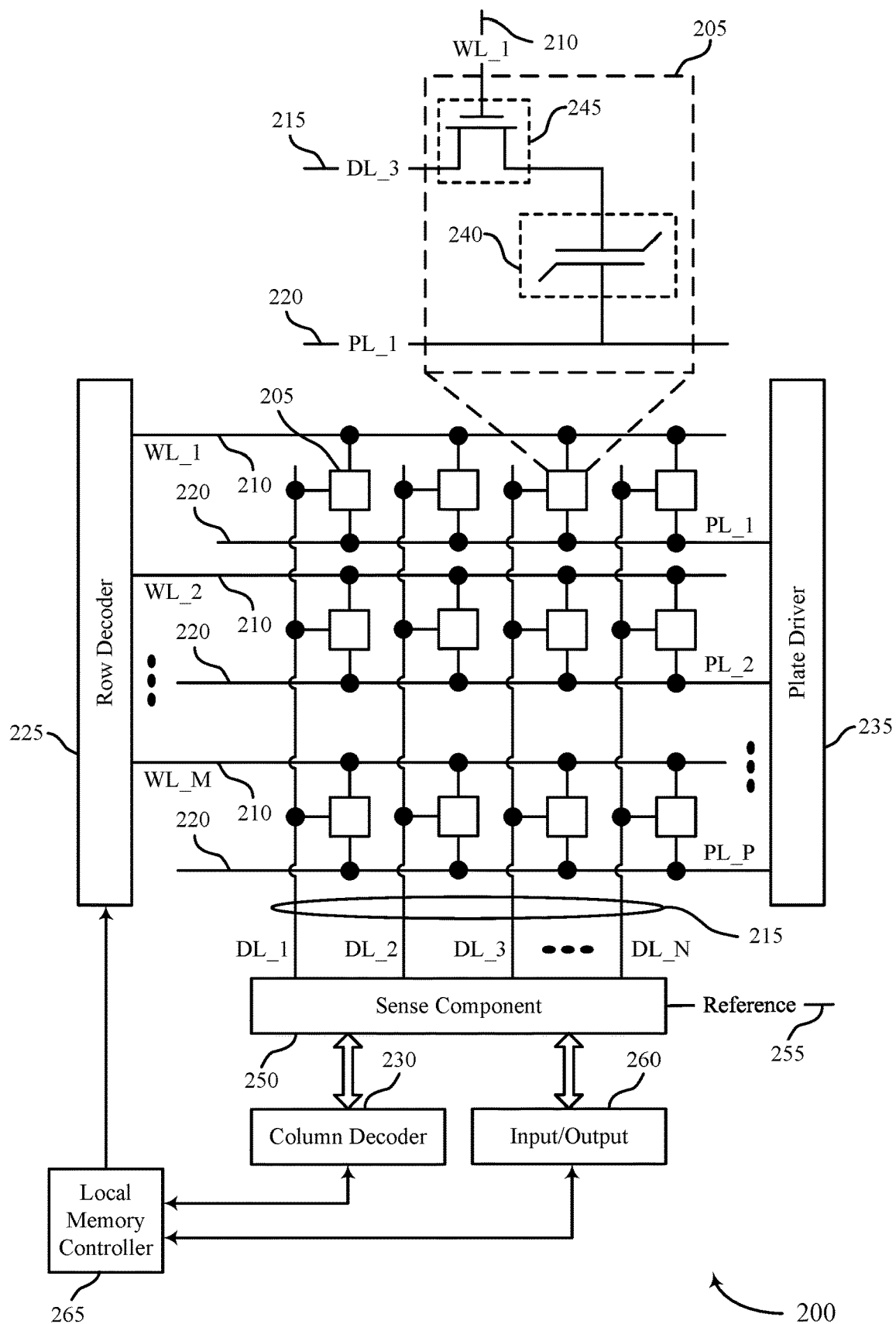
FIG. 2 illustrates an example of a memory die that supports data masking for memory in accordance with examples as disclosed herein.

FIG. 2 illustrates an example of a memory die 200 that supports data masking for memory in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

In some examples, a memory cell 205 may store a state (e.g., polarization state or dielectric charge) representative of the programmable states in a capacitor. In ferroelectric random access memory (FeRAM) architectures, the memory cell 205 may include a capacitor 240 that includes a ferroelectric material to store a charge and/or a polarization representative of the programmable state. The memory cell 205 may include a logic storage component, such as capacitor 240, and a switching component 245 (e.g., a cell selection component). The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., word lines 210, digit lines 215, and plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding. Memory cells 205 may be positioned at intersections of the word lines 210, the digit lines 215, and/or the plate lines 220.

Operations such as reading and writing may be performed on memory cells 205 by activating access lines such as a word line 210, a digit line 215, or a plate line 220. By biasing a word line 210, a digit line 215, and a plate line 220 (e.g., applying a voltage to the word line 210, digit line 215, or plate line 220), a single memory cell 205 may be accessed at their intersection. The intersection of a word line 210 and a digit line 215 in a two-dimensional or in a three-dimensional configuration may be referred to as an address of a memory cell 205. Activating a word line 210, a digit line 215, or a plate line 220 may include applying a voltage to the respective line.

Accessing the memory cells 205 may be controlled through a row decoder 225, a column decoder 230, or a plate driver 235, or a combination thereof. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to a reference 255 (e.g., a reference voltage). The detected logic state of the memory cell 205 may be provided as an output of the sense component 250 (e.g., to an input/output 260), and may indicate the detected logic state to another component of a memory device (e.g., a memory device 110) that includes the memory die 200.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host (e.g., a host device 105) based on performing the one or more operations. The local memory controller 265 may generate row signals and column address signals to activate the target word line 210, the target digit line 215, and the target plate line 220. The local memory controller 265 also may generate and control various signals (e.g., voltages, currents) used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a write operation (e.g., a programming operation) on one or more memory cells 205 of the memory die 200. During a write operation, a memory cell 205 of the memory die 200 may be programmed to store a desired state (e.g., logic state, charge state). The local memory controller 265 may identify a target memory cell 205 on which to perform the write operation. The local memory controller 265 may identify a target word line 210 and a target digit line 215 coupled with the target memory cell 205 (e.g., an address of the target memory cell 205). The local memory controller 265 may activate the target word line 210 and the target digit line 215 (e.g., applying a voltage to the word line 210 or digit line 215) to access the target memory cell 205. The local memory controller 265 may apply a signal (e.g., a write pulse, a write voltage) to the digit line 215 during the write operation to store a specific state (e.g., charge) in the capacitor 240 of the memory cell 205. The signal used as part of the write operation may include one or more voltage levels over a duration.

The local memory controller 265 may be operable to perform a read operation (e.g., a sense operation) on one or more memory cells 205 of the memory die 200. During a read operation, the state (e.g., logic state, charge state, polarization state) stored in a memory cell 205 of the memory die 200 may be evaluated (e.g., read, determined, identified). The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal (e.g., charge, voltage) to the sense component 250 in response to biasing the access lines. The sense component 250 may amplify the signal. The local memory controller 265 may activate the sense component 250 (e.g., latch the sense component) and compare the signal received from the memory cell 205 to a reference (e.g., the reference 255). Based on that comparison, the sense component 250 may determine a logic state that is stored on the memory cell 205.

A memory device may set multiple data masking flags for associated memory array(s) at power-up. Each data masking flag may, for example, be associated with a page (e.g., row) of memory cells and may indicate whether the data stored in the page is masked (e.g., protected) data, or whether the data is new, unmasked data (e.g., accessible data, unprotected data). The memory array may include multiple pages (e.g., rows) and each page may include multiple memory cells accessible by a same word line. Data existing at a previous power-down may be masked until an initial write or ACT command has been performed on the page after power-up, where the initial write or ACT command may result in writing masked data (e.g., a masked data pattern), write data (e.g., user data), or a combination thereof to the page. After previously stored data is overwritten to a page, the flag associated with the page may be reset, which may indicate that data stored at the page is available to be read.

Figure 3:
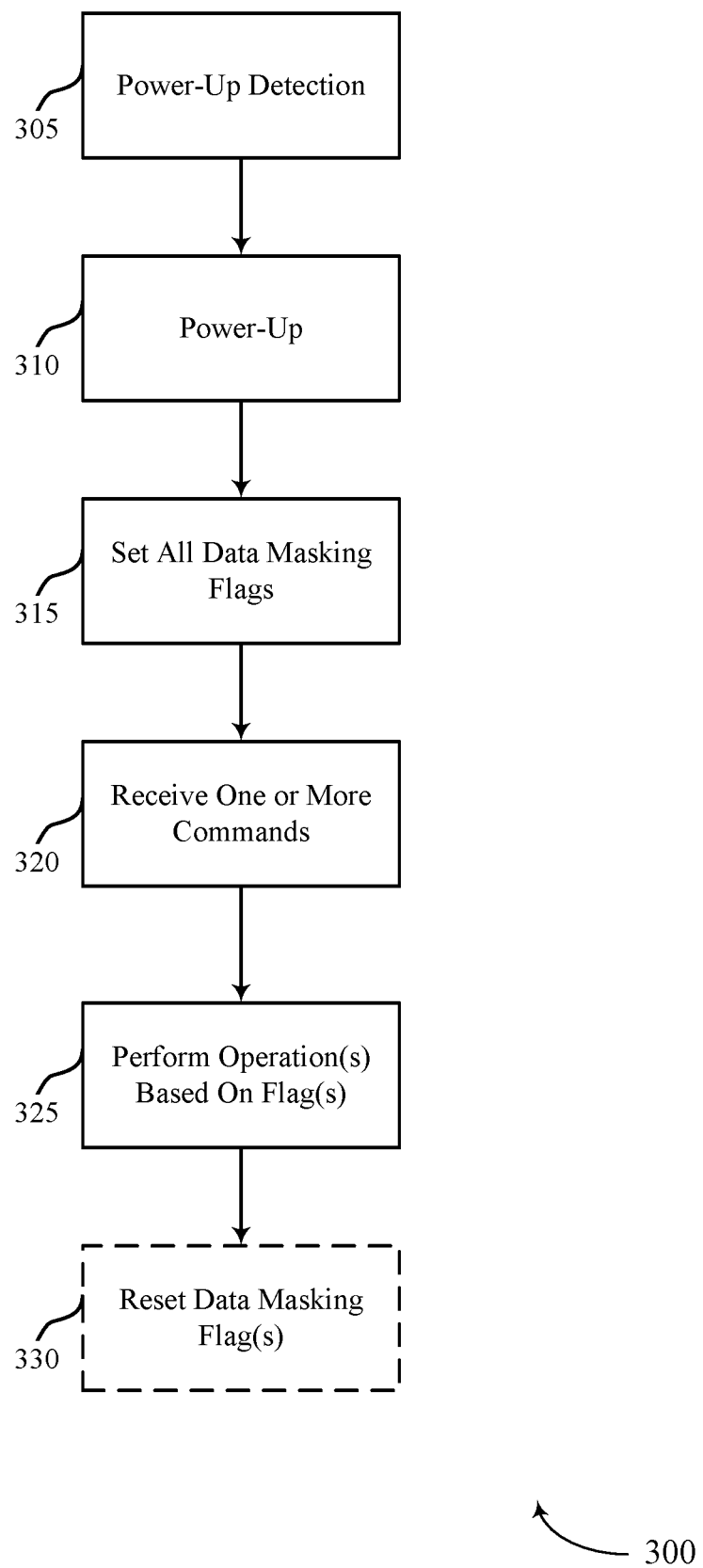
FIG. 3 illustrates an example of a flow diagram that supports data masking for memory in accordance with examples as disclosed herein.

FIG. 3 illustrates an example of a flow diagram 300 that supports data masking for memory in accordance with examples as disclosed herein. In some cases, one or more volatile memory devices (e.g., dynamic random access memory (DRAM)) within a host device may be replaced by one or more non-volatile memory devices (e.g., FeRAM) that may have a lower cost and similar operation and timing to the replaced volatile memory device(s). However, replacing volatile memory devices with non-volatile memory devices may result in some increased security risks (e.g., vulnerability to hacking) because previously stored data (e.g., data stored before power-down) may still be detectable at power-up for a non-volatile memory device.

For example, after power-up, if the host device issues a read command before first issuing a write command, the data read out by a non-volatile memory device may be data that was previously written to the memory device before power-down. Thus, data written to the memory device before power-down may still be accessible a next time the device is powered on. In some cases, these security issues may be addressed by triggering the memory device to wipe one or more associated memory arrays (e.g., delete, erase, overwrite data) at power-up or power-down. However, wiping the memory array(s) may increase a power-up or power-down time (e.g., above a permitted time) and may increase power consumption (e.g., above an available power), such that the timing or the power consumption, or both, may not meet one or more constraints of the memory device(s). Additionally, in some cases, the host device may still be able to access data on the memory device before the memory array is wiped, which may result in same or similar security issues as described previously.

In accordance with techniques and methods described herein, a non-volatile memory device may maintain data stored at associated memory array(s) at power-up, such that neither time nor power is consumed, and may protect the data from security issues by setting multiple data masking flags for the associated memory array(s). Each data masking flag may be associated with a page (e.g., row) of memory cells, for example, and may indicate whether the data stored in the page is masked (e.g., protected) data (e.g., stored before power-down), or whether the data is new, unmasked data (e.g., accessible data, unprotected data). The memory array may include multiple pages (e.g., rows) and each page may include multiple memory cells accessible by a same word line. Data existing at a previous power-down may be masked until an initial write or ACT command has been performed on the page after power-up.

In some implementations of a volatile memory device (e.g., DRAM), performing a read operation from a memory array before performing an initial write operation to the memory array may result in a violation of one or more procedures associated with the memory device (e.g., one or more standardized procedures), for example, due to the absence of data to read from the memory array. In an implementation of replacing a volatile memory device with a non-volatile device (e.g., FeRAM), previous data may exist in the memory array prior to an initial write operation, which may create a security risk (e.g., vulnerable to hacking) as described herein with respect to an initial read command, for example, even if such a read command violates one or more procedures associated with the memory device. However, by setting a data masking flag as described herein, the memory device may avoid exposing previously written data in response to such read commands (e.g., invalid read commands).

At 305 the memory device may detect that the memory device has been powered up (e.g., by the host device, by a command). At 310, the memory device may power-up (e.g., in response to a command from the host device), such as by performing one or more power-up sequences or actions.

At 315, the memory device may set a respective flag for each page of the memory device, based on the powering up of the memory device (e.g., as part of one or more power-up sequences or actions). Each flag may be associated with masking data for a corresponding page and the flags may thus, in some cases, be referred to as data masking flags. A data masking flag may indicate whether previous data (e.g., data stored before power-down) is still stored in the associated memory cells (e.g., a row or page of memory cells associated with the flag). For example, if the flag is set (e.g., turned on), indicating that previous data is stored, data read from the corresponding row may be masked (e.g., to prevent or mitigate security issues). A mask data pattern (e.g., masked data) may be a selectable pattern of bits (e.g., all 00, all 11, all AA, all 55, or some other preset pattern) that when combined with the data produces a set of bits with no meaning (e.g., dummy data, masked data). In this way, dummy data may be sent to the host device, which may prevent the host device from reading data that was stored before power-down. If the flag is not set, the memory device may read data from the associated memory cells (e.g., the page, the row) in response to a read command (e.g., may perform operations normally).

In some cases, the data masking flag may be a one bit value that may be represented by one or more memory cells. In some cases, the data masking flag may be written to one memory cell. In other cases, the data masking flag may be redundantly written to an odd number of multiple memory cells to provide error protection (e.g., a strong flag). For example, the data masking flag (e.g., a same flag value) may be written across three memory cells. If the data masking flag is set, the same value (e.g., logic value) may be written to each of the three memory cells, indicating that the flag is set. Reading the data masking flag (e.g., determining whether the flag is set) may include reading each of the three memory cells and comparing the values stored therein (e.g., logic values).

If the same value is read from each memory cell, the memory cells may indicate a status of the data masking flag via the stored values. If the same value is not read from each memory cell, the memory cells may "vote" on the correct value of the data masking flag. As such, the memory device 110 may determine the value of the data masking flag to be the value read from a majority of the memory cells (e.g., two of the three memory cells). Setting a flag as described herein may refer to placing the flag into a first state that may be referred to as a set state (e.g., corresponding to a first logic value, such as a logic 1), and resetting a flag as described herein may refer to placing the flag into a second state that may be referred to as a second state and is different than the first state (e.g., corresponding to a second logic value, such as a logic 0). Thus, for example, setting the data masking flag may include setting one or bits of the flag to be a 1 (e.g., a logic value of '1'), and resetting the flag may include setting the one or more bits of the flag to be a 0 (e.g., a logic value of '0'). Alternatively, setting the data masking flag may include setting the flag to be a 0 and resetting the flag may include setting the flag to be a 1.

At 320, the memory device may receive one or more commands from the host device. The command may include a request to read from or write to one or more of the memory arrays of the memory device (e.g., among other examples). For example, the memory device may receive a read command for at least a portion of a page of a memory array, where the page may be associated with a corresponding flag (e.g., data masking flag). In another example, the memory device may receive an ACT command for a page (e.g., in connection with a read command, write command, or other command), where the page may be associated with a corresponding flag. In some examples, the memory device may receive a write command for at least a portion of a page, where the page may be associated with a corresponding flag.

At 325, the memory device may perform one or more operations based on one or more data masking flags associated with one or more corresponding pages indicated in the command(s) received from the host device. In a first example, a data masking flag may indicate for the memory device to mask data read from the associated memory cells (e.g., page, row), such as in response to a read command, until a first write to the associated memory cells is performed. As such, in response to one or more such read commands, the memory device may return a masked data pattern (e.g., dummy data). If a write is performed to a page of memory at 325 (e.g., in response to a write command), previous data may be overwritten and the memory device may reset the flag(s) associated with the page so that subsequent read commands may be performed without masking the read data (e.g., the new data written to the memory cells).

In some cases, the memory device may receive a partial write command in which part (e.g., a portion) of a page in memory may be written to (e.g., some memory cells of the page may be written to, while some may maintain previously stored data). In this case, the portion of memory that is written to may be successfully overwritten while the portion of memory not overwritten may still contain previous data that may potentially be exposed. Accordingly, the memory device may write dummy data (e.g., a masked data pattern) to the portion of page that is not specified by the write command, which may effectively wipe the memory of the previous data. In order to support wiping previously stored data, the memory device may determine whether a write command is associated with a write operation for an entire page or a portion of the page, and the response to the write command may be based on whether the flag is set and whether the write command is associated with a write operation for the entire page or a portion of the page (e.g., additional, dummy data may be written to a portion of the page for a partial write operation).

In a second example, the data masking flag may indicate for the memory device to mask data read from the associated memory cells (e.g., page, row) until a first ACT command is performed. Accordingly, in response or a first ACT command, the memory device may load dummy data (e.g., all is or all 0s) into one or more sense components associated with the ACT command, which may either be rewritten back to the cells in accordance with a precharge command following a read command, or may be replaced (e.g., at the one or more sense components, fully or partially replaced) by write data from a write command (e.g., followed by a precharge command to write such data back to the memory cell(s)). As such, the memory device may not consider a partial write command scenario (e.g., may not determine whether a write command is for a full page or a portion of the page) because the entire page of memory may be written in response to an ACT command (e.g., with write data, with masked data, or a combination thereof).

In some examples, executing an ACT command sequence for one or more memory cells (e.g., ferroelectric memory cells) may include performing multiple sets of operations. For example, a first set of operations in the ACT command sequence may be associated with connecting one or more memory cells to one or more respective digit lines. As such, the first set of operations may include activating a memory bank or memory section addressed by the ACT command while a row address included in the ACT command is decoded.

A second set of operations in the ACT command may be associated with exchanging charge between the one or more memory cells with the one or more digit lines. Accordingly, the second set of operations may include charging the digit lines addressed by the ACT command to a non-zero voltage and activating a word line that is coupled with a row of memory cells. After the word line is activated and the access voltage is applied across the row of memory cells, the second set of operations may include waiting a predetermined duration for a signal to develop on the digit lines as charge is exchanged between the row of memory cells and the digit lines. In some examples, a voltage of the digit lines may be maintained at a sensing voltage while the signal is developed, and an amplification capacitor (e.g., or other component) may be used to measure an amount of charge used to maintain the sensing voltage.

A third set of operations in the ACT command sequence may be associated with sensing a voltage of the one or more digit lines to determine the logic states stored in the one or more memory cells. As such, the third set of operations may include closing gates that isolate (or "isolation gates") one or more sense components from the digit lines, thereby connecting the sense component(s) to the digit lines. After connecting the sense component(s) to the digit lines, the sense component(s) may be activated to sense logic states stored by the row of memory cells and digit lines. After sensing and latching the logic states of the row of memory cells, the third set of operations may include removing the applied voltage from across the row of memory cells to complete the ACT command sequence.

In the case of a read command that follows (e.g., is associated with) the ACT command, the memory device may read the data from the sense component(s) after performing the ACT command sequence (e.g., and in some cases may read out masked data). In the case of a write command that follows (e.g., is associated with) the ACT command, the memory device may write the data indicated in the write command to the sense component(s) after the ACT command (e.g., and before an associated PRE command). In some examples, executing a precharge command sequence for one or more memory cells (e.g., ferroelectric memory cells) may follow performance of a write command or a read command, and may include performance of multiple sets of operations. For example, a precharge command sequence may include a first set of operations associated with writing previously sensed logic states back to the one or more memory cells. The precharge command sequence may also include a second set of operations associated with disconnecting the one or more memory cells from the one or more digit lines.

At 330, the memory device may reset the data masking flag(s) in accordance with a completed first write command or first ACT command (e.g., but in some cases, not for a first read command). Performing a write command or ACT command for a page in memory may result in the contents of the page being cleared of any previous data, and may reduce (e.g., eliminate) a risk of reading previous data from that page, which may increase security. Additionally, use of data masking flags may be compliant with timing and power constraints of the memory device because a relatively small number of memory cells may be written (e.g., one flag per page) at power-up, for example, compared to writing an entire memory array in order to wipe the memory.

For example, in some cases an impact on access time may be as low as 0.1 or 0.2 nanoseconds, and implementing one additional flag per page may result in a relatively low increase of utilized memory (e.g., approximately 1%). In this way, data may remain in the memory array at power-up, thus conserving power while also making the data unavailable to a possible hacker until the data is overwritten. Once the data masking flag has been cleared for a page, subsequent reading operations may be performed normally (e.g., because new user or masked data has been written to the page). In some cases, the data masking flag may undergo "cycling" during power cycling and may undergo standard wear-leveling in consequence of being part of the page.

Figure 4:
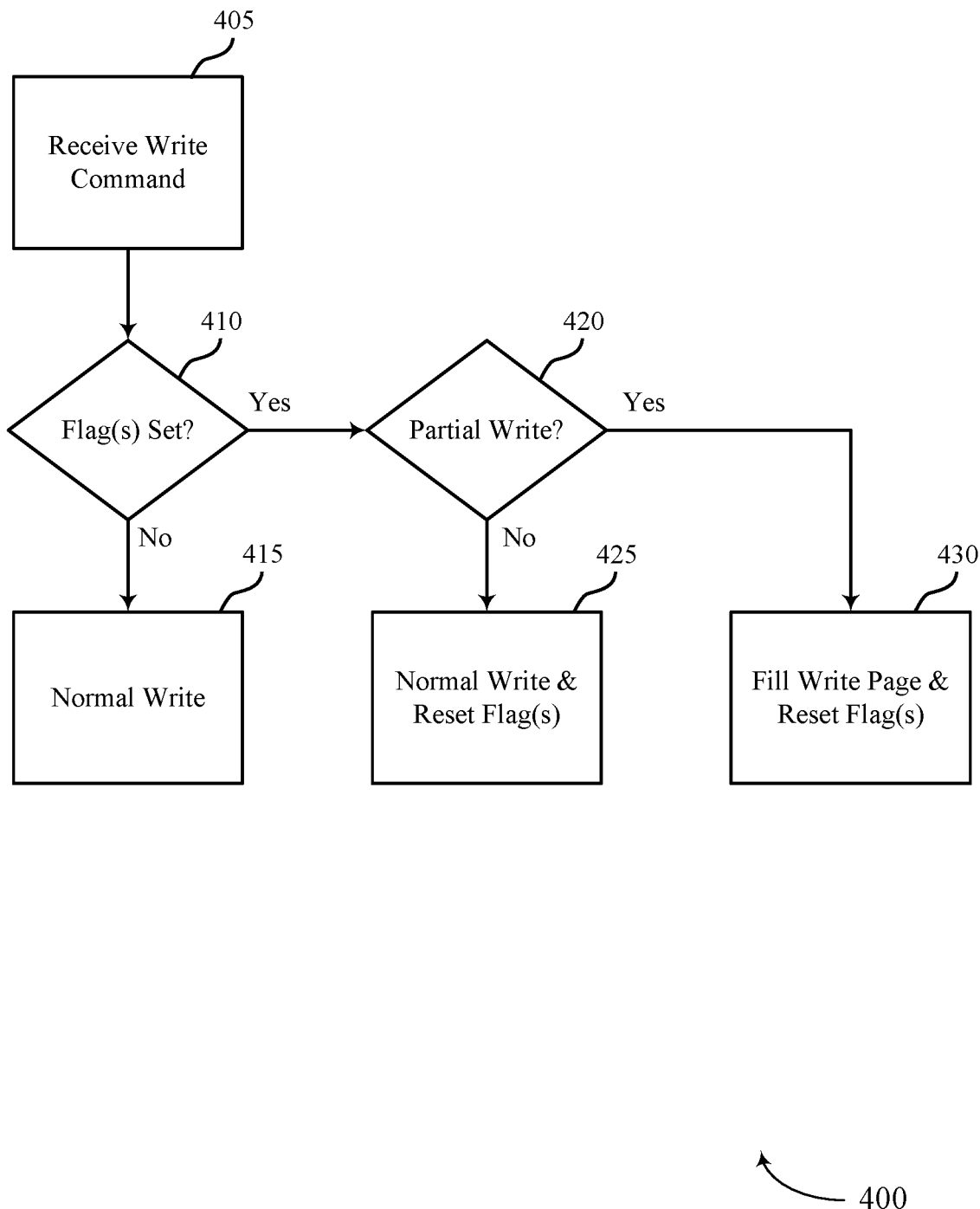
FIG. 4 illustrates an example of a flow diagram that supports data masking for memory in accordance with examples as disclosed herein.

FIG. 4 illustrates an example of a flow diagram 400 that supports data masking for memory in accordance with examples as disclosed herein. Flow diagram 400 may be an example of 320, 325, and 330 of flow diagram 300. As such, prior to 405, data masking flags of a memory device (e.g., of one or more memory arrays) may be set at power-up. The flow diagram 400 may illustrate one or more steps or operations performed, for example, with respect to the first example described with reference to FIG. 3, in which data masking flags may be reset based on one or more write operations.

At 405, the memory device may receive a write command (e.g., from a host device) for at least a portion of a page of a memory array, where the page may be associated with a data masking flag. In some cases, the write command may include performing an ACT command on one or more associated memory cells (e.g., for the at least the portion of the page).

In some cases, the memory device may receive a read command (e.g., at or before 405, instead of a write command). The read command may be for at least a portion of a page and the page may be associated with a data masking flag. In such cases, if the data masking flag is set, the memory device may apply a masked data pattern (e.g., all 0s or all 1s) to the read data and output a masked data pattern that may be different than data stored at the at least portion of the page. If the data masking flag is not set (e.g., is reset), a previously performed write command may have written data (e.g., user data, user data and dummy data) to the associated memory cells. Therefore, the data may be available to be read and the memory device may read out the data stored at the memory cells.

At 410, the memory device may determine whether a data masking flag associated with the page is set based in part on the write command received at 405. In some cases, the data masking flag may be implemented as multiple memory cells and checking the data masking flag may include reading each memory cell associated with the flag and "voting" on the correct value of the flag, as described with reference to FIG. 3. In some cases, the data masking flag may be implemented in a manner similar to a flag implementation for flagging data that has a flipped value.

At 415, the memory device may perform a normal write operation if the memory device determines that the data masking flag was not set (e.g., reset) at 410. In some cases, the data masking flag may be reset if the memory device has performed a write operation on the page since power-up. As such, the previous data still available at the page of memory at power-up may have been wiped (e.g., replaced with new data).

At 420, the memory device may additionally determine if a partial write operation (e.g., a write operation for a portion of the page) has been requested if the memory device determines that the data masking flag was set at 410. In such cases (e.g., because the flag is set), there may be previous data available at the page of memory.

At 425, the memory device may perform a normal write operation (e.g., a write operation for the full page) if the memory device determines that the write command was not a partial write command at 420. As such, the entire page of memory may be written with data indicated by the write command and any previous data stored at the page may be effectively erased. The memory device may the reset the data masking flag (e.g., change the flag value) in response to performing the write operation, thus indicating that any subsequent read or write commands may be performed normally (e.g., without masking data).

At 430, the memory device may fill a portion of the page with dummy data (e.g., a masked data pattern) if the memory device determines that the write command is a partial write command at 420. The write command for the page may, for example, replace data in a first portion of the page, and the memory device may replace other data in a second portion of the page (e.g., a remainder of the page), such that the memory device may clear the page of previous data (e.g., the entire page may be cleared). Accordingly, the memory device may write user data to the portion of the memory page indicated in the write command and the memory device may write dummy data (e.g., a mask such as all 0s or all 1s) to the portion of the memory page that may not be indicated in the write command (e.g., perform a masked write). Accordingly, the page of memory may be effectively wiped of previous data and the memory device may reset the data masking flag (e.g., change the flag value). As such, subsequent read and write requests may be performed normally.

Figure 5:
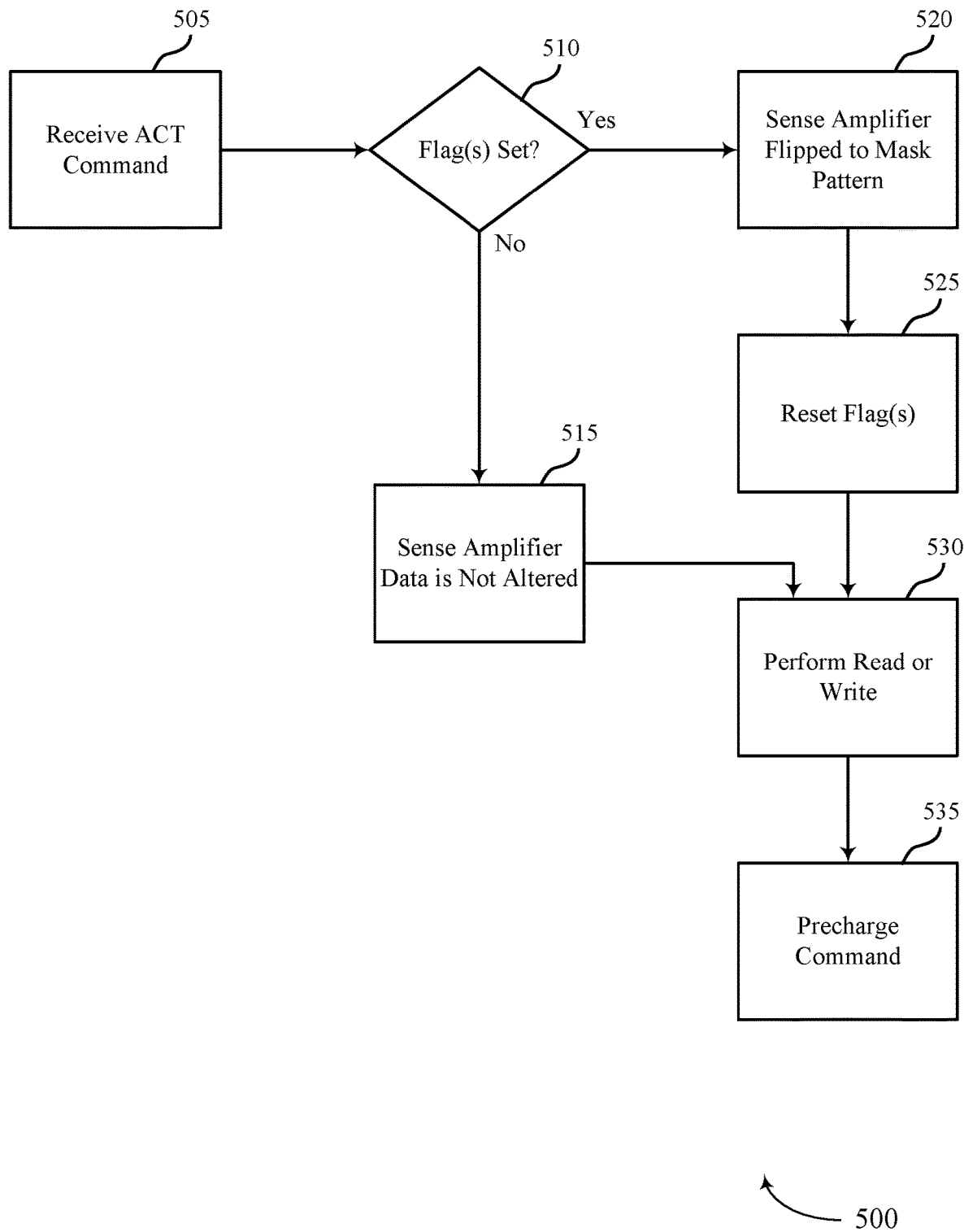
FIG. 5 illustrates an example of a flow diagram that supports data masking for memory in accordance with examples as disclosed herein.

FIG. 5 illustrates an example of a flow diagram 500 that supports data masking for memory in accordance with examples as disclosed herein. Flow diagram 500 may be an example of 320, 325, and 330 of flow diagram 300. As such, prior to 505, data masking flags of a memory device (e.g., of one or more memory arrays) may be set at power-up. The flow diagram 500 may illustrate one or more steps or operations performed, for example, with respect to the second example described with reference to FIG. 3, in which data masking flags may be reset based on one or more ACT operations. As such, flow diagram 500 may be similar to flow diagram 400, and may provide the additional benefit that write commands may be handled uniformly by the memory device (e.g., there may be no difference between how write and partial write commands are handled). As such, the flow diagram 500 may provide a less complex implementation than flow diagram 400 because the flow diagram 500 may be conditional on a single variable (e.g., a data masking flag).

At 505, the memory device may receive an ACT command (e.g., from a host device), where the ACT command may be associated with a page of (e.g., row) of a memory array of the memory device. The ACT command may be received, for example, after power-up and after the initial setting of the data masking flags. In some cases, the ACT command may be associated with a read operation, write operation, or one or more other operations (e.g., a refresh operation, memory management operation). Based on receiving the ACT command, one or more sense components may sense and store the contents of the memory cells of the associated page.

At 510, the memory device may determine if a data masking flag associated with the page is set. The data masking flag may track the first time a given page receives an ACT command after power-up. In other words, the flag may be set if the memory device has not performed an ACT command since power-up for the associated page. In some cases, the data masking flag may be implemented as a one bit value on a single memory cell of the page. In other cases, the data masking flag may be implemented as a one bit value that is written across multiple cells of the page (e.g., for redundancy). In such cases, the flag may be implemented as an odd number of memory cells that "vote" on the value of the flag. Since the flag may be implemented as one or more cells of the memory array, the flag may undergo standard wear leveling as being part of the page.

If the flag is not set (e.g., the flag is reset), at 515, the memory device may not alter (e.g., may determine not to alter) the data in the sense component(s). The data may not be altered, for example, because any previous data that existed on the page (e.g., before power-up) may have already been overwritten by a previous operation. For example, the memory device may have written the page with write data (e.g., user data) during a previous write operation. Additionally or alternatively, the memory device may have written the page with dummy data (e.g., a masked data pattern) during a previous read operation. In some cases, the memory device may have written the page with a combination of write data (e.g., user data) and dummy data (e.g., a masked data pattern) during a previous partial write operation. Thus, if the flag is reset at 510 (e.g., a value of the flag indicates that the flag is reset), the memory device 110 may determine that subsequent operations (e.g., read operations) may not expose previous data (e.g., data existing at power-down).

After the operations of 515 or 525, as applicable, the memory device may proceed to perform a read or write command associated with the ACT command (e.g., or another command associated with the ACT command) at 530. Following the read or write command, the memory device may perform an associated precharge command and write data from the sense component(s) (e.g., data read from the sense component(s), data written to the sense component(s)) to the page of memory cells.

Additionally or alternatively, if the flag is set, at 520 the memory device may flip the data in the sense component(s) to a mask pattern (e.g., all 0s or all 1s) in order to obscure previous data that may be available at (e.g., read from) the page. For example, the sense component(s) may be set to a preset pattern (e.g., masked data pattern) such that upon performance of the associated precharge command, the memory cells of the page (including the cells related to the flag) may be rewritten (e.g., with dummy data). For example, flipping the data may result in the previous data being unavailable to an eventual read command. As part of this operation, the value of the flag cell(s) may also be set to a different value at the sense component(s), such that the flag may be reset (e.g., a reset value may be written) upon performance of the precharge command.

At 525 the memory device may reset the data masking flag indicating that any subsequent operation (e.g. read, write, precharge) may not expose previous data. At this point, the previous data may still physically exist on the memory page, but because the sense component(s) may include a masked data pattern (e.g., as set at 520), any accessing of the data (e.g., via a read operation) may involve accessing the masked data in the sense component(s). Specifically, previous data on the page may be inaccessible because the masked data in the sense component(s) may be read out, and may be written back to the memory cells of the page after performing the current operation (e.g., before the memory cells are read again). Accordingly, the page may be considered cleared of previous data.

In some cases, an operation performed at 530 may overwrite some of the contents of the sense component(s), such as for a write or partial write operation. In other cases, an operation performed at 530 may not overwrite any of the contents of the sense component (e.g., for a read operation). For a read operation, the memory device may read out the masked data pattern programmed into the sense component(s), such that masked data may be returned in response to the read command (e.g., with the flag set). Based on the bit replacement (e.g., for a write operation), any bits at the sense component(s) that are not overwritten may retain their values, such that these bits, when written back to the corresponding cell(s), may represent a masked pattern that may be accessible for future read operations (e.g., without compromising previous data). Any bits that are overwritten at the sense component(s) may represent write data (e.g., user data), which may also be accessible for future read operations.

At 530, the memory device may perform a read or write operation (e.g., in association with the ACT command, as received from the host device). In a full write operation (e.g., writing the entire page), the memory device may write user data to the sense component(s), where the data may correspond to each memory cell of the page. As such, the data may overwrite any mask pattern that may exist in the sense component(s). In some cases, a write operation may include a partial write of the page in which case the memory device may write user data to a portion of the page. As such, the user data may overwrite a portion of the contents of the sense component(s) and the other portion of the sense component(s) may include the remaining mask pattern. Additionally or alternatively, the memory device may perform a read operation. In this case, the memory device may read the mask pattern stored in the sense component(s).

A precharge operation performed at 535 may include writing the contents of the sense component(s) back to the memory cells of the page. For example, in the case of a read operation, dummy data (e.g., a masked data pattern) may be written back to the page. In the case of a write operation, write data (e.g., user data) may be written back to the page, and in the case of a partial write operation some write data (e.g., user data) and some dummy data may be written back to the page. Thus, by flipping the data in the sense component(s) to a mask pattern, any bits of the sense component(s) (e.g., which may be written back to memory cells of the page) that are not written to by the host device, may be written with dummy data, effectively overwriting the data of the page for any combination of ACT command with another command.

At 535, the memory device 110 may perform a precharge operation (e.g., in response to receiving a precharge command), where execution of the precharge operation may include writing the content of the sense component(s) back to the memory cells of the page. The memory device may write user data, dummy data, or a combination thereof to the memory cells, for example, based on the operation performed at 530. For example, if a read operation was performed at 530, each memory cell of the page may be written with dummy data. If a write operation was performed at 530, each memory cell of the page may be written with write data (e.g., user data). If a partial write was performed at 530, a combination of user data and dummy data may be written to the page. Accordingly, each memory cell of the page may be clear of previous data and implement data security without deleting the entire contents of the memory array at power-up. In accordance with the flow diagram 500 the memory device may support rewriting data during a precharge operation regardless of a type of operation performed at 530.

Figure 6:
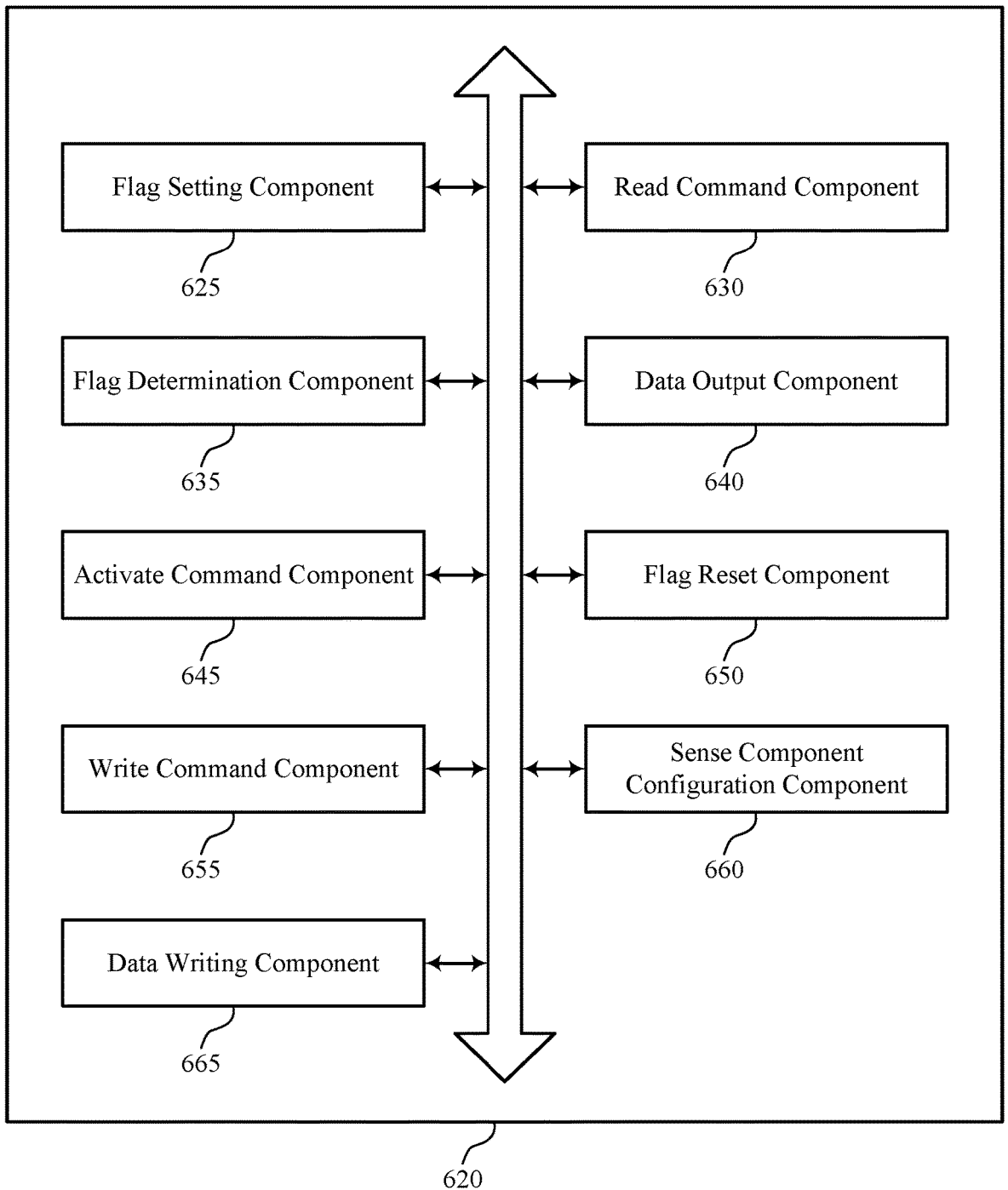
FIG. 6 shows a block diagram of a memory device that supports data masking for memory in accordance with examples as disclosed herein.

FIG. 6 shows a block diagram 600 of a memory device 620 that supports data masking for memory in accordance with examples as disclosed herein. The memory device 620 may be an example of aspects of a memory device as described with reference to FIGS. 1 through 5. The memory device 620, or various components thereof, may be an example of means for performing various aspects of data masking for memory as described herein. For example, the memory device 620 may include a flag setting component 625, a read command component 630, a flag determination component 635, a data output component 640, an activate command component 645, a flag reset component 650, a write command component 655, a sense component configuration component 660, a data writing component 665, or any combination thereof. Each of these components may communicate, directly or indirectly, with one another (e.g., via one or more buses).

The flag setting component 625 may be configured as or otherwise support a means for setting, at a memory device, a plurality of flags corresponding to a plurality of pages of the memory device based at least in part on powering up the memory device, where each flag of the plurality of flags is associated with masking data for a corresponding page of the plurality of pages. The read command component 630 may be configured as or otherwise support a means for receiving a read command for at least a portion of a first page of the plurality of pages, the first page associated with a first flag of the plurality of flags. The flag determination component 635 may be configured as or otherwise support a means for determining whether the first flag associated with the first page is set based at least in part on receiving the read command. The data output component 640 may be configured as or otherwise support a means for outputting data in response to the read command, where a content of the data is based at least in part on whether the first flag is set.

In some examples, to support outputting the data in response to the read command, the data output component 640 may be configured as or otherwise support a means for outputting a masked data pattern based at least in part on the first flag being set, the masked data pattern different than data stored at the at least the portion of the first page.

In some examples, to support outputting the data in response to the read command, the data output component 640 may be configured as or otherwise support a means for outputting first data stored at the at least the portion of the first page based at least in part on the first flag being reset.

In some examples, the activate command component 645 may be configured as or otherwise support a means for receiving an activate command for a second page of the plurality of pages, the second page associated with a second flag of the plurality of flags. In some examples, the flag determination component 635 may be configured as or otherwise support a means for determining whether the second flag associated with the second page is set based at least in part on receiving the activate command.

In some examples, the sense component configuration component 660 may be configured as or otherwise support a means for configuring a plurality of sense components associated with the second page to output a masked data pattern based at least in part on determining that the second flag is set. In some examples, the flag reset component 650 may be configured as or otherwise support a means for resetting the second flag based at least in part on configuring the plurality of sense components to output the masked data pattern.

In some examples, the write command component 655 may be configured as or otherwise support a means for receiving a write command for at least a portion of a second page of the plurality of pages, the second page associated with a second flag of the plurality of flags. In some examples, the flag determination component 635 may be configured as or otherwise support a means for determining whether the second flag associated with the second page is set based at least in part on receiving the write command. In some examples, the write command component 655 may be configured as or otherwise support a means for determining whether the write command is associated with a write operation for an entirety of the second page or a portion of the second page, where data written to the at least the portion of the second page in response to the write command is based at least in part on whether the second flag is set and whether the write command is associated with a write operation for the entirety of the second page or the portion of the second page.

In some examples, the data writing component 665 may be configured as or otherwise support a means for writing data indicated by the write command to the second page based at least in part on the second flag being set and the write operation being associated with the entirety of the second page. In some examples, the flag reset component 650 may be configured as or otherwise support a means for resetting the second flag based at least in part on writing the data indicated by the write command.

In some examples, the data writing component 665 may be configured as or otherwise support a means for writing data indicated by the write command to the portion of the second page and writing a masked data pattern to an additional portion of the second page based at least in part on the second flag being set and the write operation being associated with the portion of the second page. In some examples, the flag reset component 650 may be configured as or otherwise support a means for resetting the second flag based at least in part on writing the data indicated by the write command and writing the masked data pattern.

In some examples, to support setting the plurality of flags, the flag setting component 625 may be configured as or otherwise support a means for writing, for a respective flag, a value to one or more memory cells associated with the respective flag, the value indicative of the respective flag being set.

In some examples, the plurality of pages includes all pages of a memory array of the memory device. In some examples, the one or more memory cells are in a same row as a page associated with the respective flag. In some examples, the one or more memory cells include three or more memory cells.

In some examples, to support determining whether the first flag is set, the flag determination component 635 may be configured as or otherwise support a means for identifying a value stored in a majority of the one or more memory cells, the stored value indicative of whether the first flag is set.

In some examples, the flag setting component 625 may be configured as or otherwise support a means for setting, at a memory device, a plurality of flags corresponding to a plurality of pages of the memory device based at least in part on powering up the memory device, where each flag of the plurality of flags is associated with masking data for a corresponding page of the plurality of pages. The activate command component 645 may be configured as or otherwise support a means for receiving an activate command for a first page of the plurality of pages, the first page associated with a first flag of the plurality of flags. The flag reset component 650 may be configured as or otherwise support a means for resetting the first flag associated with the first page based at least in part on receiving the activate command.

In some examples, the flag determination component 635 may be configured as or otherwise support a means for determining whether the first flag associated with the first page is set based at least in part on receiving the activate command. In some examples, the sense component configuration component 660 may be configured as or otherwise support a means for configuring a plurality of sense components associated with the first page to output a masked data pattern based at least in part on determining that the first flag is set.

In some examples, the write command component 655 may be configured as or otherwise support a means for receiving a write command associated with the activate command. In some examples, the sense component configuration component 660 may be configured as or otherwise support a means for loading data indicated by the write command to one or more sense components of the plurality of sense components based at least in part on receiving the write command. In some examples, the data writing component 665 may be configured as or otherwise support a means for writing data stored at the plurality of sense components to the first page, where the data stored at the plurality of sense components includes the data indicated by the write command or a combination of the masked data pattern and the data indicated by the write command.

In some examples, the read command component 630 may be configured as or otherwise support a means for receiving a read command associated with the activate command. In some examples, the data output component 640 may be configured as or otherwise support a means for outputting the masked data pattern in response to the read command and based at least in part on configuring the plurality of sense components to output the masked data pattern. In some examples, the data writing component 665 may be configured as or otherwise support a means for writing the masked data pattern to the first page using the plurality of sense components.

In some examples, the plurality of pages includes all pages of a memory array of the memory device. In some examples, to support setting the plurality of flags, the flag setting component 625 may be configured as or otherwise support a means for writing, for a respective flag, a first value to one or more memory cells associated with the respective flag, the first value indicative of the respective flag being set.

In some examples, to support resetting the first flag, the flag setting component 625 may be configured as or otherwise support a means for writing, for the first flag, a second value to one or more memory cells associated with the first flag, the second value indicative of the first flag being reset.

In some examples, the flag setting component 625 may be configured as or otherwise support a means for setting, at a memory device, a plurality of flags corresponding to a plurality of pages of the memory device based at least in part on powering up the memory device, where each flag of the plurality of flags is associated with masking data for a corresponding page of the plurality of pages. The write command component 655 may be configured as or otherwise support a means for receiving a write command for at least a portion of a first page of the plurality of pages, the first page associated with a first flag of the plurality of flags. In some examples, the flag reset component 650 may be configured as or otherwise support a means for resetting the first flag associated with the first page based at least in part on receiving the write command.

In some examples, the read command component 630 may be configured as or otherwise support a means for receiving a read command associated with the first page before receiving the write command. In some examples, the flag determination component 635 may be configured as or otherwise support a means for determining whether the first flag associated with the first page is set based at least in part on receiving the read command. In some examples, the data output component 640 may be configured as or otherwise support a means for outputting a masked data pattern in response to the read command based at least in part on determining that the first flag is set.

In some examples, the read command component 630 may be configured as or otherwise support a means for receiving a read command associated with the first page after receiving the write command. In some examples, the flag determination component 635 may be configured as or otherwise support a means for determining whether the first flag associated with the first page is set based at least in part on receiving the read command. In some examples, the data output component 640 may be configured as or otherwise support a means for outputting first data stored at the first page in response to the read command based at least in part on the first flag being reset.

In some examples, the write command component 655 may be configured as or otherwise support a means for determining whether the write command is associated with a write operation for an entirety of the first page or a portion of the first page. In some examples, the flag determination component 635 may be configured as or otherwise support a means for determining whether the first flag associated with the first page is set based at least in part on receiving the write command.

In some examples, the data writing component 665 may be configured as or otherwise support a means for writing data indicated by the write command to the first page based at least in part on the first flag being set and the write operation being associated with the entirety of the first page.

In some examples, the data writing component 665 may be configured as or otherwise support a means for writing data indicated by the write command to the portion of the first page and writing a masked data pattern to an additional portion of the first page based at least in part on the first flag being set and the write operation being associated with the portion of the first page.

In some examples, the plurality of pages includes all pages of a memory array of the memory device. In some examples, to support setting the plurality of flags, the flag setting component 625 may be configured as or otherwise support a means for writing, for a respective flag, a first value to one or more memory cells associated with the respective flag, the first value indicative of the respective flag being set.

In some examples, to support resetting the first flag, the flag setting component 625 may be configured as or otherwise support a means for writing, for the first flag, a second value to one or more memory cells associated with the first flag, the second value indicative of the first flag being reset.

Figure 7:
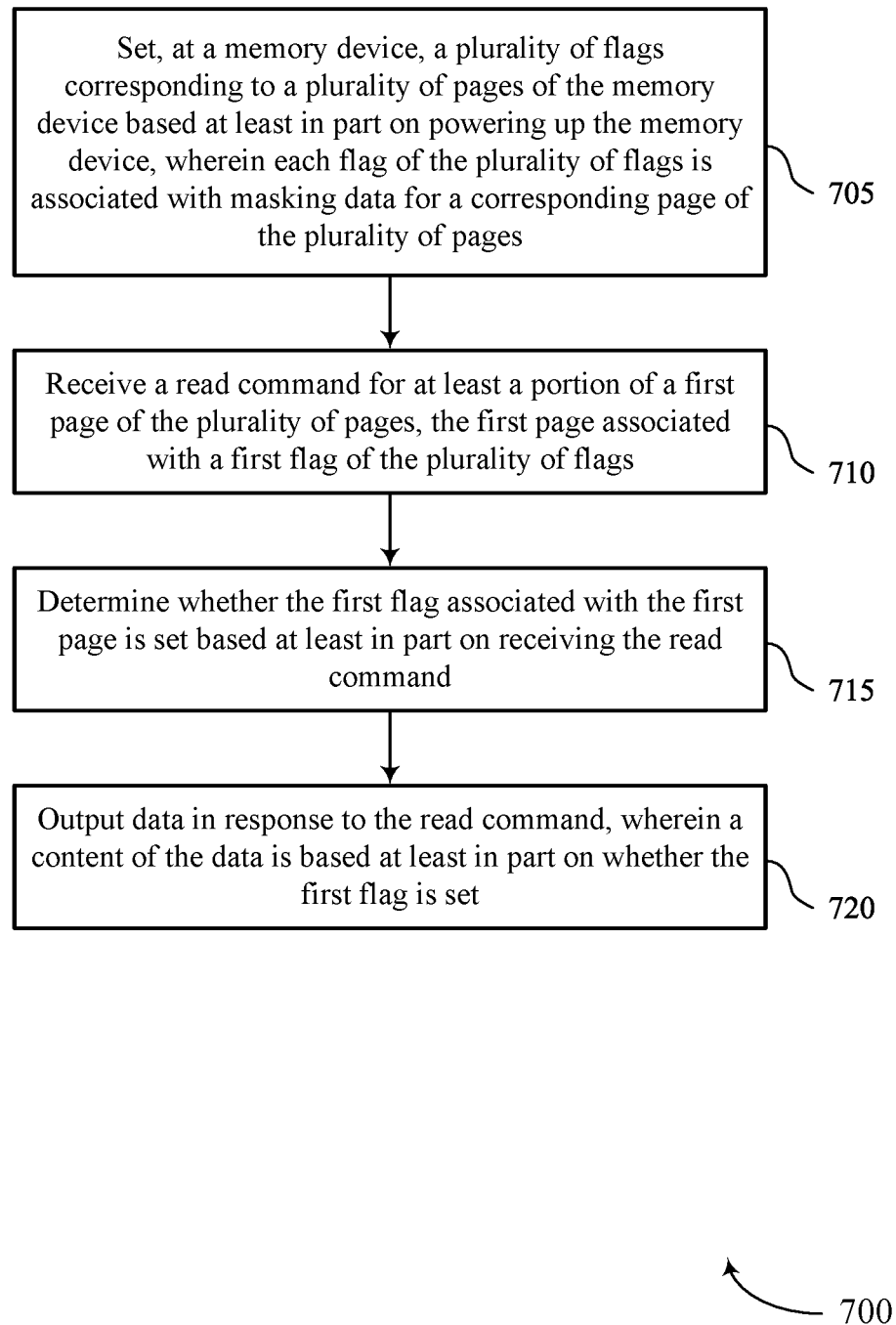
FIGS. 7 through 9 show flowcharts illustrating a method or methods that support data masking for memory in accordance with examples as disclosed herein.

FIG. 7 shows a flowchart illustrating a method 700 that supports data masking for memory in accordance with examples as disclosed herein. The operations of method 700 may be implemented by a memory device or its components as described herein. For example, the operations of method 700 may be performed by a memory device as described with reference to FIGS. 1 through 6. In some examples, a memory device may execute a set of instructions to control the functional elements of the device to perform the described functions. Additionally, or alternatively, the memory device may perform aspects of the described functions using special-purpose hardware.

At 705, the method may include setting, at a memory device, a plurality of flags corresponding to a plurality of pages of the memory device based at least in part on powering up the memory device, where each flag of the plurality of flags is associated with masking data for a corresponding page of the plurality of pages. The operations of 705 may be performed in accordance with examples as disclosed herein. In some examples, aspects of the operations of 705 may be performed by a flag setting component 625 as described with reference to FIG. 6.

At 710, the method may include receiving a read command for at least a portion of a first page of the plurality of pages, the first page associated with a first flag of the plurality of flags. The operations of 710 may be performed in accordance with examples as disclosed herein. In some examples, aspects of the operations of 710 may be performed by a read command component 630 as described with reference to FIG. 6.

At 715, the method may include determining whether the first flag associated with the first page is set based at least in part on receiving the read command. The operations of 715 may be performed in accordance with examples as disclosed herein. In some examples, aspects of the operations of 715 may be performed by a flag determination component 635 as described with reference to FIG. 6.

At 720, the method may include outputting data in response to the read command, where a content of the data is based at least in part on whether the first flag is set. The operations of 720 may be performed in accordance with examples as disclosed herein. In some examples, aspects of the operations of 720 may be performed by a data output component 640 as described with reference to FIG. 6.

In some examples, an apparatus as described herein may perform a method or methods, such as the method 700. The apparatus may include features, circuitry, logic, means, or instructions (e.g., a non-transitory computer-readable medium storing instructions executable by a processor), or any combination thereof for performing the following aspects of the present disclosure:

Aspect 1: A method, apparatus, or non-transitory computer-readable medium including operations, features, circuitry, logic, means, or instructions, or any combination thereof for setting, at a memory device, a plurality of flags corresponding to a plurality of pages of the memory device based at least in part on powering up the memory device, where each flag of the plurality of flags is associated with masking data for a corresponding page of the plurality of pages; receiving a read command for at least a portion of a first page of the plurality of pages, the first page associated with a first flag of the plurality of flags; determining whether the first flag associated with the first page is set based at least in part on receiving the read command; and outputting data in response to the read command, where a content of the data is based at least in part on whether the first flag is set.

Aspect 2: The method, apparatus, or non-transitory computer-readable medium of aspect 1 where operations, features, circuitry, logic, means, or instructions, or any combination thereof for outputting the data in response to the read command include operations, features, circuitry, logic, means, or instructions, or any combination thereof for outputting a masked data pattern based at least in part on the first flag being set, the masked data pattern different than data stored at the at least the portion of the first page.

Aspect 3: The method, apparatus, or non-transitory computer-readable medium of any of aspects 1 through 2 where operations, features, circuitry, logic, means, or instructions, or any combination thereof for outputting the data in response to the read command include operations, features, circuitry, logic, means, or instructions, or any combination thereof for outputting first data stored at the at least the portion of the first page based at least in part on the first flag being reset.

Aspect 4: The method, apparatus, or non-transitory computer-readable medium of any of aspects 1 through 3, further including operations, features, circuitry, logic, means, or instructions, or any combination thereof for receiving an activate command for a second page of the plurality of pages, the second page associated with a second flag of the plurality of flags and determining whether the second flag associated with the second page is set based at least in part on receiving the activate command.

Aspect 5: The method, apparatus, or non-transitory computer-readable medium of aspect 4, further including operations, features, circuitry, logic, means, or instructions, or any combination thereof for configuring a plurality of sense components associated with the second page to output a masked data pattern based at least in part on determining that the second flag is set and resetting the second flag based at least in part on configuring the plurality of sense components to output the masked data pattern.

Aspect 6: The method, apparatus, or non-transitory computer-readable medium of any of aspects 1 through 5, further including operations, features, circuitry, logic, means, or instructions, or any combination thereof for receiving a write command for at least a portion of a second page of the plurality of pages, the second page associated with a second flag of the plurality of flags; determining whether the second flag associated with the second page is set based at least in part on receiving the write command; and determining whether the write command is associated with a write operation for an entirety of the second page or a portion of the second page, where data written to the at least the portion of the second page in response to the write command is based at least in part on whether the second flag is set and whether the write command is associated with a write operation for the entirety of the second page or the portion of the second page.

Aspect 7: The method, apparatus, or non-transitory computer-readable medium of aspect 6, further including operations, features, circuitry, logic, means, or instructions, or any combination thereof for writing data indicated by the write command to the second page based at least in part on the second flag being set and the write operation being associated with the entirety of the second page and resetting the second flag based at least in part on writing the data indicated by the write command.

Aspect 8: The method, apparatus, or non-transitory computer-readable medium of any of aspects 6 through 7, further including operations, features, circuitry, logic, means, or instructions, or any combination thereof for writing data indicated by the write command to the portion of the second page and writing a masked data pattern to an additional portion of the second page based at least in part on the second flag being set and the write operation being associated with the portion of the second page and resetting the second flag based at least in part on writing the data indicated by the write command and writing the masked data pattern.

Aspect 9: The method, apparatus, or non-transitory computer-readable medium of any of aspects 1 through 8 where the plurality of pages includes all pages of a memory array of the memory device.

Aspect 10: The method, apparatus, or non-transitory computer-readable medium of any of aspects 1 through 9 where operations, features, circuitry, logic, means, or instructions, or any combination thereof for setting the plurality of flags include operations, features, circuitry, logic, means, or instructions, or any combination thereof for writing, for a respective flag, a value to one or more memory cells associated with the respective flag, the value indicative of the respective flag being set.

Aspect 11: The method, apparatus, or non-transitory computer-readable medium of aspect 10 where the one or more memory cells are in a same row as a page associated with the respective flag.

Aspect 12: The method, apparatus, or non-transitory computer-readable medium of any of aspects 10 through 11 where the one or more memory cells include three or more memory cells.

Aspect 13: The method, apparatus, or non-transitory computer-readable medium of any of aspects 10 through 12 where determining whether the first flag is set includes operations, features, circuitry, logic, means, or instructions, or any combination thereof for identifying a value stored in a majority of the one or more memory cells, the stored value indicative of whether the first flag is set.

Figure 8:
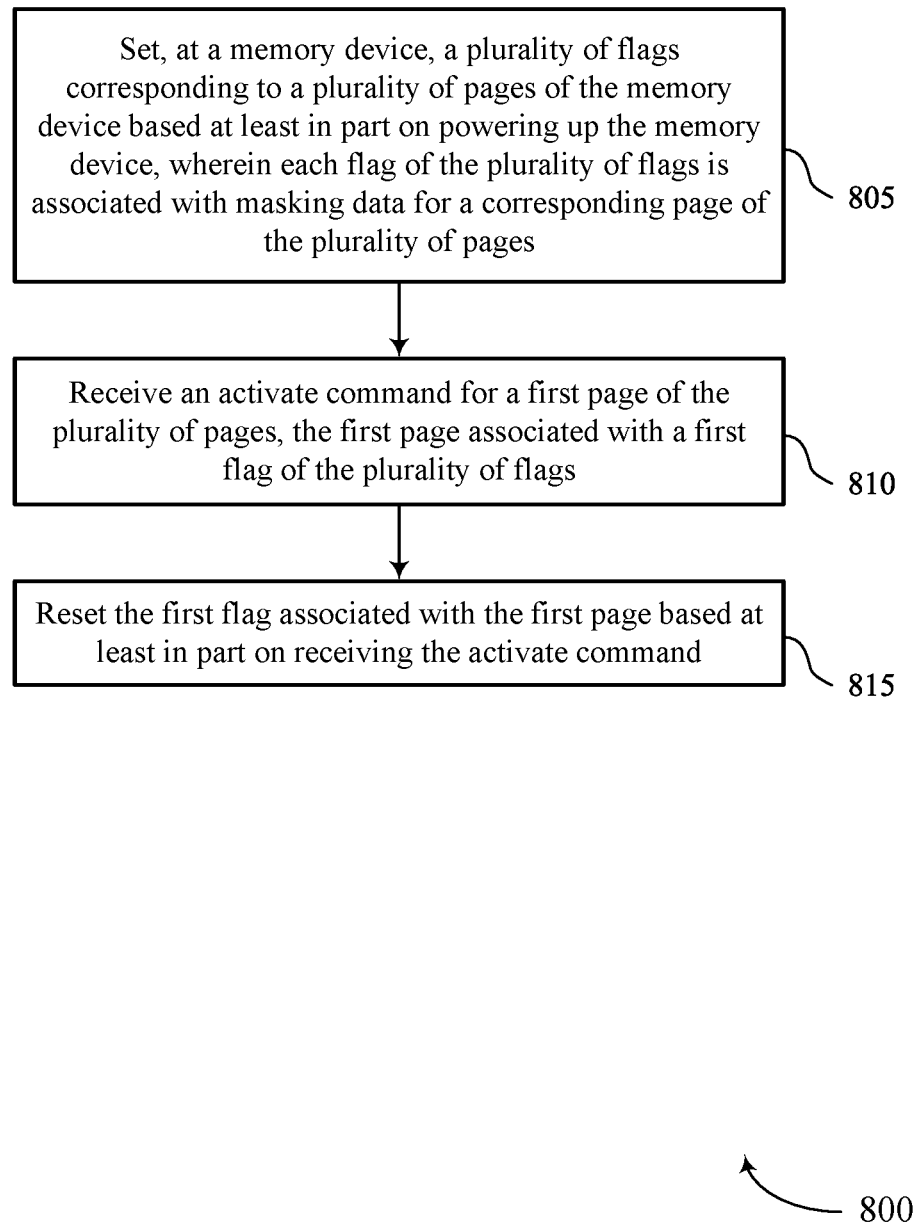

FIG. 8 shows a flowchart illustrating a method 800 that supports data masking for memory in accordance with examples as disclosed herein. The operations of method 800 may be implemented by a memory device or its components as described herein. For example, the operations of method 800 may be performed by a memory device as described with reference to FIGS. 1 through 6. In some examples, a memory device may execute a set of instructions to control the functional elements of the device to perform the described functions. Additionally, or alternatively, the memory device may perform aspects of the described functions using special-purpose hardware.

At 805, the method may include setting, at a memory device, a plurality of flags corresponding to a plurality of pages of the memory device based at least in part on powering up the memory device, where each flag of the plurality of flags is associated with masking data for a corresponding page of the plurality of pages. The operations of 805 may be performed in accordance with examples as disclosed herein. In some examples, aspects of the operations of 805 may be performed by a flag setting component 625 as described with reference to FIG. 6.

At 810, the method may include receiving an activate command for a first page of the plurality of pages, the first page associated with a first flag of the plurality of flags. The operations of 810 may be performed in accordance with examples as disclosed herein. In some examples, aspects of the operations of 810 may be performed by an activate command component 645 as described with reference to FIG. 6.

At 815, the method may include resetting the first flag associated with the first page based at least in part on receiving the activate command. The operations of 815 may be performed in accordance with examples as disclosed herein. In some examples, aspects of the operations of 815 may be performed by a flag reset component 650 as described with reference to FIG. 6.

In some examples, an apparatus as described herein may perform a method or methods, such as the method 800. The apparatus may include features, circuitry, logic, means, or instructions (e.g., a non-transitory computer-readable medium storing instructions executable by a processor), or any combination thereof for performing the following aspects of the present disclosure:

Aspect 14: A method, apparatus, or non-transitory computer-readable medium including operations, features, circuitry, logic, means, or instructions, or any combination thereof for setting, at a memory device, a plurality of flags corresponding to a plurality of pages of the memory device based at least in part on powering up the memory device, where each flag of the plurality of flags is associated with masking data for a corresponding page of the plurality of pages; receiving an activate command for a first page of the plurality of pages, the first page associated with a first flag of the plurality of flags; and resetting the first flag associated with the first page based at least in part on receiving the activate command.

Aspect 15: The method, apparatus, or non-transitory computer-readable medium of aspect 14, further including operations, features, circuitry, logic, means, or instructions, or any combination thereof for determining whether the first flag associated with the first page is set based at least in part on receiving the activate command and configuring a plurality of sense components associated with the first page to output a masked data pattern based at least in part on determining that the first flag is set.

Aspect 16: The method, apparatus, or non-transitory computer-readable medium of aspect 15, further including operations, features, circuitry, logic, means, or instructions, or any combination thereof for receiving a write command associated with the activate command; loading data indicated by the write command to one or more sense components of the plurality of sense components based at least in part on receiving the write command; and writing data stored at the plurality of sense components to the first page, where the data stored at the plurality of sense components includes the data indicated by the write command or a combination of the masked data pattern and the data indicated by the write command.

Aspect 17: The method, apparatus, or non-transitory computer-readable medium of any of aspects 15 through 16, further including operations, features, circuitry, logic, means, or instructions, or any combination thereof for receiving a read command associated with the activate command; outputting the masked data pattern in response to the read command and based at least in part on configuring the plurality of sense components to output the masked data pattern; and writing the masked data pattern to the first page using the plurality of sense components.

Aspect 18: The method, apparatus, or non-transitory computer-readable medium of any of aspects 14 through 17 where the plurality of pages includes all pages of a memory array of the memory device.

Aspect 19: The method, apparatus, or non-transitory computer-readable medium of any of aspects 14 through 18 where operations, features, circuitry, logic, means, or instructions, or any combination thereof for setting the plurality of flags include operations, features, circuitry, logic, means, or instructions, or any combination thereof for writing, for a respective flag, a first value to one or more memory cells associated with the respective flag, the first value indicative of the respective flag being set.

Aspect 20: The method, apparatus, or non-transitory computer-readable medium of any of aspects 14 through 19 where operations, features, circuitry, logic, means, or instructions, or any combination thereof for resetting the first flag include operations, features, circuitry, logic, means, or instructions, or any combination thereof for writing, for the first flag, a second value to one or more memory cells associated with the first flag, the second value indicative of the first flag being reset.

Figure 9:
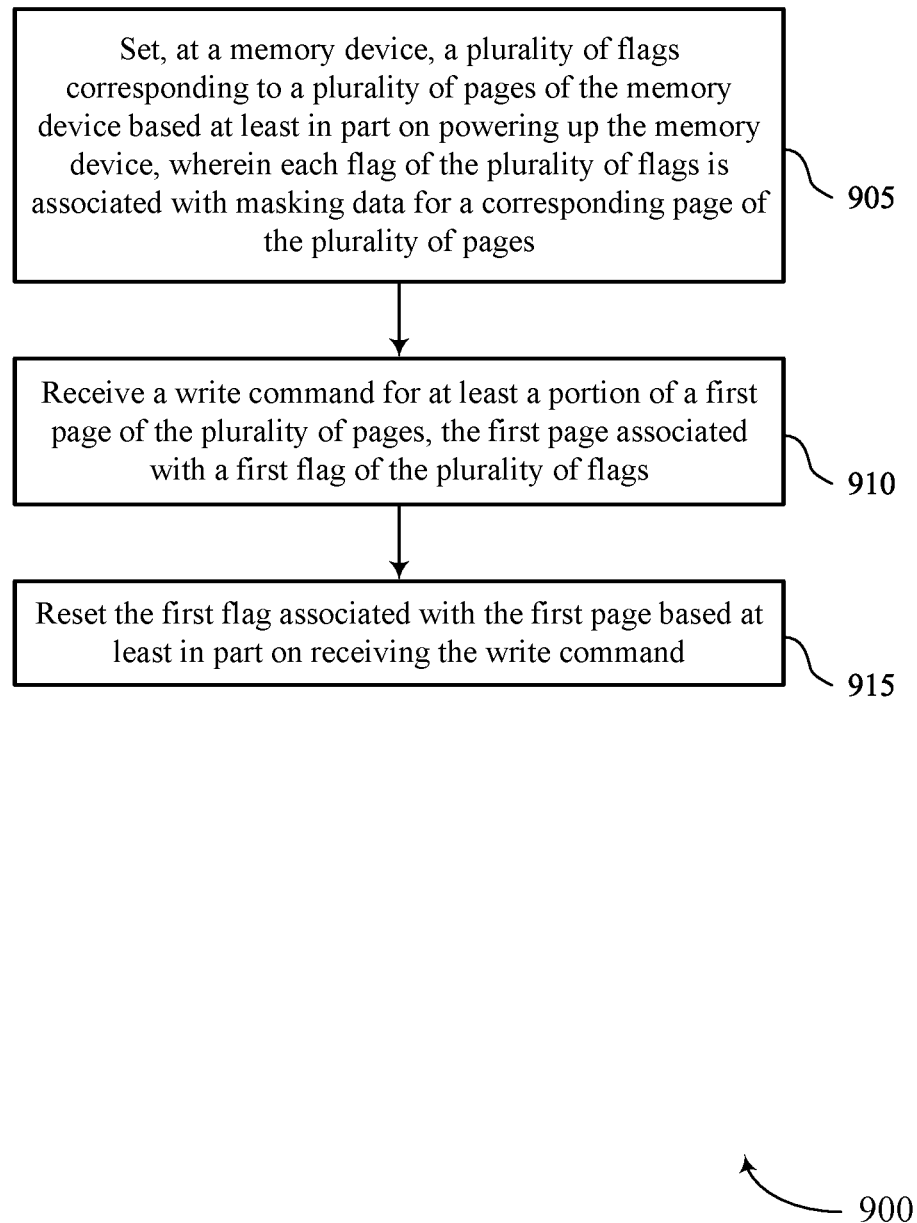

FIG. 9 shows a flowchart illustrating a method 900 that supports data masking for memory in accordance with examples as disclosed herein. The operations of method 900 may be implemented by a memory device or its components as described herein. For example, the operations of method 900 may be performed by a memory device as described with reference to FIGS. 1 through 6. In some examples, a memory device may execute a set of instructions to control the functional elements of the device to perform the described functions. Additionally, or alternatively, the memory device may perform aspects of the described functions using special-purpose hardware.

At 905, the method may include setting, at a memory device, a plurality of flags corresponding to a plurality of pages of the memory device based at least in part on powering up the memory device, where each flag of the plurality of flags is associated with masking data for a corresponding page of the plurality of pages. The operations of 905 may be performed in accordance with examples as disclosed herein. In some examples, aspects of the operations of 905 may be performed by a flag setting component 625 as described with reference to FIG. 6.

At 910, the method may include receiving a write command for at least a portion of a first page of the plurality of pages, the first page associated with a first flag of the plurality of flags. The operations of 910 may be performed in accordance with examples as disclosed herein. In some examples, aspects of the operations of 910 may be performed by a write command component 655 as described with reference to FIG. 6.

At 915, the method may include resetting the first flag associated with the first page based at least in part on receiving the write command. The operations of 915 may be performed in accordance with examples as disclosed herein. In some examples, aspects of the operations of 915 may be performed by a flag reset component 650 as described with reference to FIG. 6.

In some examples, an apparatus as described herein may perform a method or methods, such as the method 900. The apparatus may include features, circuitry, logic, means, or instructions (e.g., a non-transitory computer-readable medium storing instructions executable by a processor), or any combination thereof for performing the following aspects of the present disclosure:

Aspect 21: A method, apparatus, or non-transitory computer-readable medium including operations, features, circuitry, logic, means, or instructions, or any combination thereof for setting, at a memory device, a plurality of flags corresponding to a plurality of pages of the memory device based at least in part on powering up the memory device, where each flag of the plurality of flags is associated with masking data for a corresponding page of the plurality of pages; receiving a write command for at least a portion of a first page of the plurality of pages, the first page associated with a first flag of the plurality of flags; and resetting the first flag associated with the first page based at least in part on receiving the write command.

Aspect 22: The method, apparatus, or non-transitory computer-readable medium of aspect 21, further including operations, features, circuitry, logic, means, or instructions, or any combination thereof for receiving a read command associated with the first page before receiving the write command; determining whether the first flag associated with the first page is set based at least in part on receiving the read command; and outputting a masked data pattern in response to the read command based at least in part on determining that the first flag is set.

Aspect 23: The method, apparatus, or non-transitory computer-readable medium of any of aspects 21 through 22, further including operations, features, circuitry, logic, means, or instructions, or any combination thereof for receiving a read command associated with the first page after receiving the write command; determining whether the first flag associated with the first page is set based at least in part on receiving the read command; and outputting first data stored at the first page in response to the read command based at least in part on the first flag being reset.

Aspect 24: The method, apparatus, or non-transitory computer-readable medium of any of aspects 21 through 23, further including operations, features, circuitry, logic, means, or instructions, or any combination thereof for determining whether the write command is associated with a write operation for an entirety of the first page or a portion of the first page and determining whether the first flag associated with the first page is set based at least in part on receiving the write command.

Aspect 25: The method, apparatus, or non-transitory computer-readable medium of aspect 24, further including operations, features, circuitry, logic, means, or instructions, or any combination thereof for writing data indicated by the write command to the first page based at least in part on the first flag being set and the write operation being associated with the entirety of the first page.

Aspect 26: The method, apparatus, or non-transitory computer-readable medium of any of aspects 24 through 25, further including operations, features, circuitry, logic, means, or instructions, or any combination thereof for writing data indicated by the write command to the portion of the first page and writing a masked data pattern to an additional portion of the first page based at least in part on the first flag being set and the write operation being associated with the portion of the first page.

Aspect 27: The method, apparatus, or non-transitory computer-readable medium of any of aspects 21 through 26 where the plurality of pages includes all pages of a memory array of the memory device.

Aspect 28: The method, apparatus, or non-transitory computer-readable medium of any of aspects 21 through 27 where operations, features, circuitry, logic, means, or instructions, or any combination thereof for setting the plurality of flags include operations, features, circuitry, logic, means, or instructions, or any combination thereof for writing, for a respective flag, a first value to one or more memory cells associated with the respective flag, the first value indicative of the respective flag being set.

Aspect 29: The method, apparatus, or non-transitory computer-readable medium of any of aspects 21 through 28 where operations, features, circuitry, logic, means, or instructions, or any combination thereof for resetting the first flag include operations, features, circuitry, logic, means, or instructions, or any combination thereof for writing, for the first flag, a second value to one or more memory cells associated with the first flag, the second value indicative of the first flag being reset.

It should be noted that the methods described herein are possible implementations, and that the operations and the steps may be rearranged or otherwise modified and that other implementations are possible. Furthermore, portions from two or more of the methods may be combined.

An apparatus is described. The following provides an overview of aspects of the apparatus as described herein:

Aspect 30: An apparatus, including: a memory array; and a controller couplable with the memory array and operable to cause the apparatus to: set a plurality of flags corresponding to a plurality of pages of the memory array based at least in part on powering up the apparatus, where each flag of the plurality of flags is associated with masking data for a corresponding page of the plurality of pages; receive an activate command for a first page of the plurality of pages, the first page associated with a first flag of the plurality of flags; and reset the first flag associated with the first page based at least in part on receiving the activate command.

Aspect 31: The apparatus of aspect 30, where the controller is further operable to cause the apparatus to: determine whether the first flag associated with the first page is set based at least in part on receiving the activate command; configure a plurality of sense components associated with the first page to output a masked data pattern based at least in part on determining that the first flag is set; receive a write command associated with the activate command; load data indicated by the write command to one or more sense components of the plurality of sense components based at least in part on receiving the write command; and write data stored at the plurality of sense components to the first page, where the data stored at the plurality of sense components includes the data indicated by the write command or a combination of the masked data pattern and the data indicated by the write command.

Aspect 32: The apparatus of any of aspects 30 through 31, where the controller is further operable to cause the apparatus to: determine whether the first flag associated with the first page is set based at least in part on receiving the activate command; configure a plurality of sense components associated with the first page to output a masked data pattern based at least in part on determining that the first flag is set; receive a read command associated with the activate command; output the masked data pattern in response to the read command and based at least in part on configuring the plurality of sense components to output the masked data pattern; and write the masked data pattern to the first page using the plurality of sense components.

An apparatus is described. The following provides an overview of aspects of the apparatus as described herein:

Aspect 33: An apparatus, including: a memory array; and a controller couplable with the memory array and operable to cause the apparatus to: set a plurality of flags corresponding to a plurality of pages of the memory array based at least in part on powering up the apparatus, where each flag of the plurality of flags is associated with masking data for a corresponding page of the plurality of pages; receiving a write command for at least a portion of a first page of the plurality of pages, the first page associated with a first flag of the plurality of flags; and resetting the first flag associated with the first page based at least in part on receiving the write command.

Aspect 34: The apparatus of aspect 33, where the controller is further operable to cause the apparatus to: determine whether the write command is associated with a write operation for an entirety of the first page or a portion of the first page based at least in part on receiving the write command; determine whether the first flag associated with the first page is set based at least in part on receiving the write command; and write data indicated by the write command to the first page based at least in part on the first flag being set and the write operation being associated with the entirety of the first page.

Aspect 35: The apparatus of any of aspects 33 through 34, where the controller is further operable to cause the apparatus to: determine whether the write command is associated with a write operation for an entirety of the first page or a portion of the first page based at least in part on receiving the write command; determine whether the first flag associated with the first page is set based at least in part on receiving the write command; and write data indicated by the write command to the portion of the first page and writing a masked data pattern to an additional portion of the first page based at least in part on the first flag being set and the write operation being associated with the portion of the first page.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (e.g., in conductive contact with, connected with, coupled with) one another if there is any electrical path (e.g., conductive path) between the components that can, at any time, support the flow of signals (e.g., charge, current voltage) between the components. At any given time, a conductive path between components that are in electronic communication with each other (e.g., in conductive contact with, connected with, coupled with) may be an open circuit or a closed circuit based on the operation of the device that includes the connected components. A conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components (e.g., over a conductive path) to a closed-circuit relationship between components in which signals are capable of being communicated between components (e.g., over the conductive path). When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

As used herein, the term "electrode" may refer to an electrical conductor, and in some examples, may be employed as an electrical contact to a memory cell or other component of a memory array. An electrode may include a trace, a wire, a conductive line, a conductive layer, or the like that provides a conductive path between components of a memory array.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component (e.g., a transistor) discussed herein may represent a field-effect transistor (FET), and may comprise a three-terminal component including a source (e.g., a source terminal), a drain (e.g., a drain terminal), and a gate (e.g., a gate terminal). The terminals may be connected to other electronic components through conductive materials (e.g., metals, alloys). The source and drain may be conductive, and may comprise a doped (e.g., heavily-doped, degenerate) semiconductor region. The source and drain may be separated by a doped (e.g., lightly-doped) semiconductor region or channel. If the channel is n-type (e.g., majority carriers are electrons), then the FET may be referred to as a n-type FET. If the channel is p-type (e.g., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions (e.g., code) on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a processor, such as a DSP, an ASIC, an FPGA, discrete gate logic, discrete transistor logic, discrete hardware components, other programmable logic device, or any combination thereof designed to perform the functions described herein. A processor may be an example of a microprocessor, a controller, a microcontroller, a state machine, or any type of processor. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a computer, or a processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
    setting, at a memory device, a plurality of flags corresponding to a plurality of pages of the memory device, including a first flag corresponding to a first page, based at least in part on powering up the memory device, wherein each flag of the plurality of flags is associated with masking data for a corresponding page of the plurality of pages;
    receiving a first read command for at least a portion of the first page of the plurality of pages, the first page associated with the first flag of the plurality of flags;
    outputting a masked data pattern in response to the first read command based at least in part on the first flag being set, the masked data pattern different than first data stored at the at least the portion of the first page;
    resetting the first flag corresponding to the first page;
    receiving a second read command for at least the portion of the first page; and
    outputting second data stored at the at least the portion of the first page in response to the second read command based at least in part on the first flag being reset.

2. The method of claim 1, further comprising:
    receiving an activate command for a second page of the plurality of pages, the second page associated with a second flag of the plurality of flags; and
    determining whether the second flag associated with the second page is set based at least in part on receiving the activate command.

3. The method of claim 2, further comprising:
    configuring a plurality of sense components associated with the second page to output the masked data pattern based at least in part on determining that the second flag is set; and
    resetting the second flag based at least in part on configuring the plurality of sense components to output the masked data pattern.

4. The method of claim 1, further comprising:
    receiving a write command for at least a portion of a second page of the plurality of pages, the second page associated with a second flag of the plurality of flags;
    determining whether the second flag associated with the second page is set based at least in part on receiving the write command; and
    determining whether the write command is associated with a write operation for an entirety of the second page or the portion of the second page, wherein data written to the at least the portion of the second page in response to the write command is based at least in part on whether the second flag is set and whether the write command is associated with the write operation for the entirety of the second page or the portion of the second page.

5. The method of claim 4, further comprising:
    writing the data indicated by the write command to the second page based at least in part on the second flag being set and the write operation being associated with the entirety of the second page; and
    resetting the second flag based at least in part on writing the data indicated by the write command.

6. The method of claim 4, further comprising:
    writing the data indicated by the write command to the portion of the second page and writing the masked data pattern to an additional portion of the second page based at least in part on the second flag being set and the write operation being associated with the portion of the second page; and
    resetting the second flag based at least in part on writing the data indicated by the write command and writing the masked data pattern.

7. The method of claim 1, wherein the plurality of pages comprises all pages of a memory array of the memory device.

8. The method of claim 1, wherein setting the plurality of flags comprises:
    writing, for a respective flag, a value to one or more memory cells associated with the respective flag, the value indicative of the respective flag being set.

9. The method of claim 8, wherein the one or more memory cells are in a same row as a page associated with the respective flag.

10. The method of claim 8, wherein the one or more memory cells comprise three or more memory cells.

11. The method of claim 8, further comprising:
    identifying a second value stored in a majority of the one or more memory cells, the second value indicative of whether the first flag is set.

12. A method, comprising:
    setting, at a memory device, a plurality of flags corresponding to a plurality of pages of the memory device based at least in part on powering up the memory device, wherein each flag of the plurality of flags is associated with masking data for a corresponding page of the plurality of pages;
    receiving an activate command for a first page of the plurality of pages, the first page associated with a first flag of the plurality of flags; and
    resetting the first flag associated with the first page based at least in part on receiving the activate command.

13. The method of claim 12, further comprising:
    determining whether the first flag associated with the first page is set based at least in part on receiving the activate command; and
    configuring a plurality of sense components associated with the first page to output a masked data pattern based at least in part on determining that the first flag is set.

14. The method of claim 13, further comprising:
    receiving a write command associated with the activate command;
    loading data indicated by the write command to one or more sense components of the plurality of sense components based at least in part on receiving the write command; and
    writing second data stored at the plurality of sense components to the first page, wherein the second data stored at the plurality of sense components comprises the data indicated by the write command or a combination of the masked data pattern and the data indicated by the write command.

15. The method of claim 13, further comprising:
receiving a read command associated with the activate command;
outputting the masked data pattern in response to the read command and based at least in part on configuring the plurality of sense components to output the masked data pattern; and
writing the masked data pattern to the first page using the plurality of sense components.

16. The method of claim 12, wherein the plurality of pages comprises all pages of a memory array of the memory device.

17. The method of claim 12, wherein setting the plurality of flags comprises:
writing, for a respective flag, a first value to one or more memory cells associated with the respective flag, the first value indicative of the respective flag being set.

18. The method of claim 12, wherein resetting the first flag comprises:
writing, for the first flag, a second value to one or more memory cells associated with the first flag, the second value indicative of the first flag being reset.

19. A method, comprising:
setting, at a memory device, a plurality of flags corresponding to a plurality of pages of the memory device based at least in part on powering up the memory device, wherein each flag of the plurality of flags is associated with masking data for a corresponding page of the plurality of pages;
receiving a write command for at least a portion of a first page of the plurality of pages, the first page associated with a first flag of the plurality of flags; and
resetting the first flag associated with the first page based at least in part on receiving the write command.

20. The method of claim 19, further comprising:
receiving a read command associated with the first page before receiving the write command;
determining whether the first flag associated with the first page is set based at least in part on receiving the read command; and
outputting a masked data pattern in response to the read command based at least in part on determining that the first flag is set.

21. The method of claim 19, further comprising:
receiving a read command associated with the first page after receiving the write command;
determining whether the first flag associated with the first page is set based at least in part on receiving the read command; and
outputting first data stored at the first page in response to the read command based at least in part on the first flag being reset.

22. The method of claim 19, further comprising:
determining whether the write command is associated with a write operation for an entirety of the first page or the portion of the first page; and
determining whether the first flag associated with the first page is set based at least in part on receiving the write command.

23. The method of claim 22, further comprising:
writing data indicated by the write command to the first page based at least in part on the first flag being set and the write operation being associated with the entirety of the first page.

24. The method of claim 22, further comprising:
writing data indicated by the write command to the portion of the first page and writing a masked data pattern to an additional portion of the first page based at least in part on the first flag being set and the write operation being associated with the portion of the first page.

25. The method of claim 19, wherein the plurality of pages comprises all pages of a memory array of the memory device.

26. The method of claim 19, wherein setting the plurality of flags comprises:
writing, for a respective flag, a first value to one or more memory cells associated with the respective flag, the first value indicative of the respective flag being set.

27. The method of claim 19, wherein resetting the first flag comprises:
writing, for the first flag, a second value to one or more memory cells associated with the first flag, the second value indicative of the first flag being reset.

28. An apparatus, comprising:
a memory array; and
a controller couplable with the memory array and operable to cause the apparatus to:
set a plurality of flags corresponding to a plurality of pages of the memory array based at least in part on powering up the apparatus, wherein each flag of the plurality of flags is associated with masking data for a corresponding page of the plurality of pages;
receive an activate command for a first page of the plurality of pages, the first page associated with a first flag of the plurality of flags; and
reset the first flag associated with the first page based at least in part on receiving the activate command.

29. The apparatus of claim 28, wherein the controller is further operable to cause the apparatus to:
determine whether the first flag associated with the first page is set based at least in part on receiving the activate command;
configure a plurality of sense components associated with the first page to output a masked data pattern based at least in part on determining that the first flag is set;
receive a write command associated with the activate command;
load data indicated by the write command to one or more sense components of the plurality of sense components based at least in part on receiving the write command; and
write data stored at the plurality of sense components to the first page, wherein the data stored at the plurality of sense components comprises the data indicated by the write command or a combination of the masked data pattern and the data indicated by the write command.

30. The apparatus of claim 28, wherein the controller is further operable to cause the apparatus to:
determine whether the first flag associated with the first page is set based at least in part on receiving the activate command;
configure a plurality of sense components associated with the first page to output a masked data pattern based at least in part on determining that the first flag is set;
receive a read command associated with the activate command;

output the masked data pattern in response to the read command and based at least in part on configuring the plurality of sense components to output the masked data pattern; and
write the masked data pattern to the first page using the plurality of sense components.

31. An apparatus, comprising:
a memory array; and
a controller couplable with the memory array and operable to cause the apparatus to:
set a plurality of flags corresponding to a plurality of pages of the memory array based at least in part on powering up the apparatus, wherein each flag of the plurality of flags is associated with masking data for a corresponding page of the plurality of pages;
receive a write command for at least a portion of a first page of the plurality of pages, the first page associated with a first flag of the plurality of flags; and
reset the first flag associated with the first page based at least in part on receiving the write command.

32. The apparatus of claim 31, wherein the controller is further operable to cause the apparatus to:
determine whether the write command is associated with a write operation for an entirety of the first page or the portion of the first page based at least in part on receiving the write command;
determine whether the first flag associated with the first page is set based at least in part on receiving the write command; and
write data indicated by the write command to the first page based at least in part on the first flag being set and the write operation being associated with the entirety of the first page.

33. The apparatus of claim 31, wherein the controller is further operable to cause the apparatus to:
determine whether the write command is associated with a write operation for an entirety of the first page or the portion of the first page based at least in part on receiving the write command;
determine whether the first flag associated with the first page is set based at least in part on receiving the write command; and
write data indicated by the write command to the portion of the first page and writing a masked data pattern to an additional portion of the first page based at least in part on the first flag being set and the write operation being associated with the portion of the first page.

* * * * *